US011770516B2

(12) United States Patent
Powers et al.

(10) Patent No.: US 11,770,516 B2
(45) Date of Patent: Sep. 26, 2023

(54) APPARATUS AND METHODS FOR THREE-DIMENSIONAL SENSING

(71) Applicant: Occipital, Inc., Boulder, CO (US)

(72) Inventors: Jeffrey Roger Powers, San Francisco, CA (US); Vikas Muppidi Reddy, Boulder, CO (US); Paul Jakob Schroeder, Boulder, CO (US); Christopher Caleb Slaughter, Boulder, CO (US); Roger Wayne Landowski, Boulder, CO (US); Davis Thorp Foster, Boulder, CO (US); Evan Haley Fletcher, Boulder, CO (US)

(73) Assignee: XRPro, LLC, Boulder, CO (US)

( * ) Notice: Subject to any disclaimer, the term of this patent is extended or adjusted under 35 U.S.C. 154(b) by 0 days.

(21) Appl. No.: 17/646,324

(22) Filed: Dec. 29, 2021

(65) Prior Publication Data

US 2022/0124299 A1 Apr. 21, 2022

Related U.S. Application Data

(62) Division of application No. 15/398,531, filed on Jan. 4, 2017, now Pat. No. 11,218,688.

(Continued)

(51) Int. Cl.
*H04N 13/254* (2018.01)
*G06T 7/521* (2017.01)
(Continued)

(52) U.S. Cl.
CPC .......... *H04N 13/254* (2018.05); *G01J 1/4204* (2013.01); *G01J 1/4257* (2013.01);
(Continued)

(58) Field of Classification Search
CPC .. G01J 1/4204; G01J 1/4257; G01J 2001/446; G02B 27/106; G02B 27/1086;
(Continued)

(56) References Cited

U.S. PATENT DOCUMENTS 6,229,913 B1 5/2001 Nayar et al.
7,978,189 B2 * 7/2011 Sprague ................. G09G 3/025
359/204.3

(Continued)

OTHER PUBLICATIONS

Final Office Action dated Mar. 3, 2020 for U.S. Appl. No. 15/398,531 "Apparatus and Methods for Three-Dimensional Sensing", Powers, 6 pages.

(Continued)

*Primary Examiner* — John R Lee
(74) *Attorney, Agent, or Firm* — Lee & Hayes, P.C.

(57) ABSTRACT

A three-dimensional (3D) sensing apparatus together with a projector subassembly is provided. The 3D sensing apparatus includes two cameras, which may be configured to capture ultraviolet and/or near-infrared light. The 3D sensing apparatus may also contain an optical filter and one or more computing processors that signal a simultaneous capture using the two cameras and processing the captured images into depth. The projector subassembly of the 3D sensing apparatus includes a laser diode, one or optical elements, and a photodiode that are useable to enable 3D capture.

20 Claims, 15 Drawing Sheets

Related U.S. Application Data

(60) Provisional application No. 62/274,713, filed on Jan. 4, 2016.

(51) Int. Cl.

| | | |
|---|---|---|
| H04N 5/33 | (2023.01) | |
| H04N 13/271 | (2018.01) | |
| H04N 13/296 | (2018.01) | |
| H04N 13/239 | (2018.01) | |
| H04N 5/225 | (2006.01) | |
| H04N 5/361 | (2011.01) | |
| H04N 5/357 | (2011.01) | |
| H04N 17/00 | (2006.01) | |
| H04N 5/232 | (2006.01) | |
| G02B 27/42 | (2006.01) | |
| G06T 7/593 | (2017.01) | |
| H01S 5/02325 | (2021.01) | |
| H01S 5/02345 | (2021.01) | |
| H01S 5/02355 | (2021.01) | |
| G01J 1/42 | (2006.01) | |
| G02B 27/10 | (2006.01) | |
| G02B 27/30 | (2006.01) | |
| H01S 5/00 | (2006.01) | |
| H01S 5/024 | (2006.01) | |
| H01S 5/42 | (2006.01) | |
| H04N 23/11 | (2023.01) | |
| H04N 23/56 | (2023.01) | |
| H04N 23/65 | (2023.01) | |
| H04N 25/61 | (2023.01) | |
| H04N 25/63 | (2023.01) | |
| H04N 13/00 | (2018.01) | |
| G01J 1/44 | (2006.01) | |

(52) U.S. Cl.
CPC ....... *G02B 27/106* (2013.01); *G02B 27/1086* (2013.01); *G02B 27/30* (2013.01); *G02B 27/4205* (2013.01); *G06T 7/521* (2017.01); *G06T 7/593* (2017.01); *H01S 5/0014* (2013.01); *H01S 5/024* (2013.01); *H01S 5/02325* (2021.01); *H01S 5/02345* (2021.01); *H01S 5/02355* (2021.01); *H01S 5/423* (2013.01); *H04N 13/239* (2018.05); *H04N 13/271* (2018.05); *H04N 13/296* (2018.05); *H04N 17/002* (2013.01); *H04N 23/11* (2023.01); *H04N 23/56* (2023.01); *H04N 23/65* (2023.01); *H04N 25/61* (2023.01); *H04N 25/63* (2023.01); *G01J 2001/446* (2013.01); *G06T 2207/10012* (2013.01); *G06T 2207/10048* (2013.01); *H04N 2013/0081* (2013.01)

(58) Field of Classification Search
CPC ... G02B 27/30; G02B 27/4205; H01S 5/0014; H01S 5/02248; H01S 5/02256; H01S 5/02276; H01S 5/024; H01S 5/423; G06T 2207/10012; G06T 2207/10048; G06T 7/521; G06T 7/593; H04N 13/0239; H04N 13/0253; H04N 13/0296; H04N 13/239; H04N 13/254; H04N 13/271; H04N 13/296; H04N 17/002; H04N 2013/0081; H04N 5/2256; H04N 5/23241; H04N 5/332; H04N 5/3572; H04N 5/361

See application file for complete search history.

(56) References Cited

U.S. PATENT DOCUMENTS

| | | | |
|---|---|---|---|
| 8,355,013 B2 * | 1/2013 | Sprague | H04N 9/3129 |
| | | | 345/204 |
| 9,451,240 B2 | 9/2016 | You et al. | |
| 9,645,482 B2 * | 5/2017 | Joseph | H04N 13/363 |
| 9,704,250 B1 | 7/2017 | Shah et al. | |
| 11,218,688 B2 * | 1/2022 | Powers | H01S 5/02355 |
| 2002/0126963 A1 | 9/2002 | Burmeister | |
| 2004/0090620 A1 | 5/2004 | Farr | |
| 2004/0246874 A1 | 12/2004 | Takagi et al. | |
| 2006/0114950 A1 | 6/2006 | Yen et al. | |
| 2007/0063125 A1 | 3/2007 | Downing, Jr. | |
| 2007/0133642 A1 | 6/2007 | Park et al. | |
| 2010/0002197 A1 * | 1/2010 | Kaneko | G03B 21/005 |
| | | | 353/31 |
| 2011/0025827 A1 | 2/2011 | Shpunt et al. | |
| 2011/0158273 A1 | 6/2011 | Okayama et al. | |
| 2012/0194650 A1 | 8/2012 | Izadi et al. | |
| 2012/0249740 A1 | 10/2012 | Lee et al. | |
| 2013/0250983 A1 | 9/2013 | Essaian et al. | |
| 2014/0168424 A1 | 6/2014 | Attar et al. | |
| 2014/0187879 A1 * | 7/2014 | Wood | A61B 5/0071 |
| | | | 600/317 |
| 2014/0240492 A1 | 8/2014 | Lee | |
| 2014/0300775 A1 | 10/2014 | Fan et al. | |
| 2015/0341609 A1 | 11/2015 | Kilcher et al. | |
| 2016/0065850 A1 | 3/2016 | Yu et al. | |
| 2016/0140700 A1 | 5/2016 | Park et al. | |
| 2016/0197452 A1 * | 7/2016 | Mor | H01S 5/423 |
| | | | 359/569 |
| 2016/0262626 A1 | 9/2016 | Pelosi et al. | |
| 2016/0306168 A1 | 10/2016 | Singh et al. | |
| 2017/0061210 A1 | 3/2017 | Ollila | |
| 2017/0083730 A1 * | 3/2017 | Feng | G06K 19/06028 |
| 2017/0194768 A1 | 7/2017 | Powers et al. | |
| 2017/0195654 A1 | 7/2017 | Powers et al. | |
| 2018/0307310 A1 | 10/2018 | McCombe et al. | |
| 2019/0034020 A1 * | 1/2019 | He | G06V 40/1318 |
| 2020/0082555 A1 * | 3/2020 | Lyer | G06T 7/579 |
| 2022/0124299 A1 * | 4/2022 | Powers | H04N 5/23241 |

OTHER PUBLICATIONS

Non Final Office Action dated Jun. 25, 2020 for U.S. Appl. No. 15/398,531, "Apparatus and Methods for Three-Dimensional Sensing", Powers, 12 pages.

Non Final Office Action dated Sep. 26, 2019 for U.S. Appl. No. 15/398,507 "Apparatus and Methods for Three-Dimensional Sensing" Powers, 9 pages.

Office action for U.S. Appl. No. 15/398,507, dated Mar. 21, 2019, Powers, "Apparatus and Methods for Three-Dimensional Sensing ", 9 pages.

Office Action for U.S. Appl. No. 15/398,531, dated Aug. 21, 2019, Powers, "Apparatus and Methods for Three-Dimensional Sensing", 9 pages.

* cited by examiner

APPARATUS AND METHODS FOR THREE-DIMENSIONAL SENSING

CROSS-REFERENCE TO RELATED APPLICATIONS

This application is a Divisional of and claims priority to U.S. application Ser. No. 15/398,531, filed on Jan. 4, 2017 and entitled "APPARATUS AND METHODS FOR THREE-DIMENSIONAL SENSING," issuing as U.S. Pat. No. 11,218,688 on Jan. 4, 2022, which is a non-provisional of and claims the benefit of U.S. Provisional Application No. 62/274,713, filed on Jan. 4, 2016, the entire contents of which are incorporated herein by reference.

TECHNICAL FIELD

This invention relates to the field of electronic imaging. More specifically, to new and useful apparatus, methods, and systems for three-dimensional (3D) imaging using image capturing devices and projected light.

BACKGROUND

Capturing 3D images, images where every pixel contains the distance to a point in the imaged scene, is of growing importance in imaging applications to manufacturing, 3D object scanning, and augmented reality.

As the field of three-dimensional (3D) imaging continues to grow rapidly as an area of technological interest with numerous applications, including applications in construction, manufacturing, research, entertainment, and medicine. A number of these applications require 3D image capture that can perform imaging in real-time and in-situ. Current 3D image capture solutions that meet these criteria are often too power-hungry to perform effectively. Also, providing a novel solution to reduce power consumption for 3D image capture systems is not only useful for current applications but is also potentially capable of opening up new fields of application as well.

Thus, there is a need in the field of 3D imaging to create new and useful methods for capturing the 3D images in accordance with the various application of a 3D image capture system. The embodiments of the present application provide such new and useful methods for capturing 3D images.

BRIEF SUMMARY

The present invention comprises an apparatus for 3D imaging, several methods for producing 3D images using the apparatus, projector subassemblies and related methods, and methods for controlling the projector used in the assembly.

The 3D sensing apparatus comprises two cameras for 3D sensing, a projector of a pre-defined pattern, an optional color camera, and one or more processors for controlling the cameras and projector and processing and/or transmitting data to a host computer. The cameras are preferably synchronized to trigger image capture simultaneously.

The 3D sensing apparatus contains an optoelectronic subassembly for projecting a pattern of light onto the scene in from of the apparatus. One embodiment of the projector uses a laser diode, one or more optical elements to create and focus the pattern, and a photodiode positioned within the housing for monitoring emitted light. Another embodiment of the projector uses an array of light emitting elements arranged on a semiconductor substrate, one or more optical elements to focus and/or create copies of the pattern embedded on the semiconductor substrate, and, optionally, a photodiode positioned within the housing for monitoring emitted light. Methods for producing the optoelectronic subassembly are described.

Methods for capturing 3D images using the apparatus are preferably provided by the invention. One method produces depth images by correlating image regions in one captured image with image regions in a second image. A second method produces depth images by correlating image regions in a first image with image regions in a second image and image regions in a captured reference image of the pattern. A third method produces depth by selecting images from one of the two depth sensing cameras, then correlating image regions from this image with a captured reference image of the pattern. A fourth method produces depth by training a machine learning system to recognize image regions in a captured reference image, then evaluating the machine learning system on captured images. The methods preferably utilize pre-processing steps that reduce error in and enhance the received images. The methods may be carried out on an embedded processor within the apparatus or after the images have been transmitted to a host computer.

The invention preferably captures imagery in such a way as to conserve power expended during operation of the processors, cameras, or projector. Power management may be conducted based on information about scene coverage, scene closeness, apparatus movement, or depth sensing frame rate.

The invention preferably utilizes methods for ensuring the eye safety of the projector. The invention also preferably utilizes methods for controlling the power emitted by the projector, heating up the projector more rapidly than its steady state duty cycle would allow, and synchronizing the projector illumination with the exposure interval of the cameras.

DETAILED DESCRIPTION

The following description of the preferred embodiments of the invention is not intended to limit the invention to these preferred embodiments, but rather to enable any person skilled in the art to make and use this invention.

Overview

In one or more systems of preferred embodiments, 3D image capture systems use one or more of a variety of techniques to capture 3D image data. Some common techniques used for capturing 3D image data include time of flight capture, structured light capture, stereoscopic capture, photometric capture, and modulated light capture. All of these techniques consume significant to large amounts of power when in operation; for example, image sensor power, processing power, and in the case of active sensing techniques, emitter power. For many of these techniques (or combinations thereof), there exists a correlation between the performance of the 3D image capture system and the power consumption of the system; that is, a given 3D image capture system is often able to provide higher quality 3D image data if designed and/or operated with a higher power budget. At the same time, keeping power consumption low can be important for enabling 3D image capture systems to be used for mobile applications. The system can be implemented on a mobile computing device, a dedicated 3D image capture device, a 3D image capture system composed of multiple components (e.g., 3D imaging system coupled to a controlling computing device), and/or any suitable 3D imaging system.

A 3D image capture system preferably allows the capture of 3D image data through one or a combination of time of flight capture, structured light capture, and stereoscopic capture. The 3D image capture system may additionally or alternatively allow 3D image capture through photometric capture, modulated capture, or any other method of 3D image capture. The 3D image capture system preferably includes at least one RGB camera or a connection for an RGB camera to collect visible light visual information about the features being imaged, but may alternatively not include an RGB camera or a connection for an RGB camera. The 3D image capture system preferably includes a processor, such as a central processing unit (CPU) and/or a graphics processing unit (GPU) for processing 3D image data from raw sensor input, but may additionally or alternatively transmit raw sensor input to be processed elsewhere. The 3D image capture system preferably is powered by a battery, but may additionally or alternatively be powered by any suitable means, including via a connection to an electrical port or the like. The 3D capture system preferably includes a motion-detecting sensor (e.g. an accelerometer, a gyroscope, or an inertial measurement unit (IMU)) but may alternatively not include a motion-detecting sensor.

1. Depth Sensing Apparatus for Power Conservation

Figure 1:
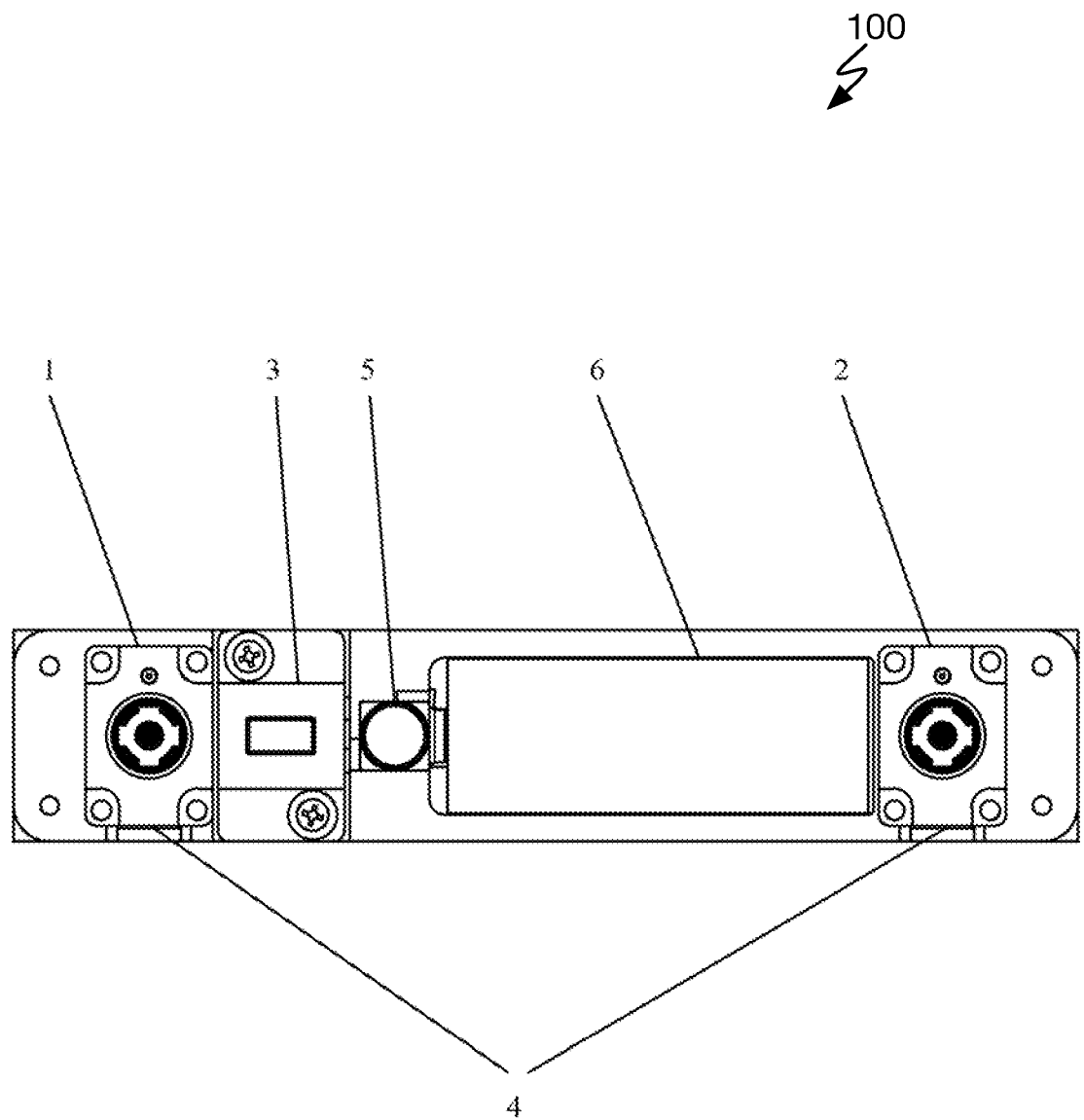
FIG. 1 illustrates a schematic of an apparatus for three-dimensional sensing in accordance with some embodiments of the present application.

As shown in FIG. 1, an apparatus 100 for performing three-dimensional (3D) sensing is illustrated. Apparatus 100 in a preferred embodiment includes a first camera 1, a second camera 2, a projector 3, a color camera 5, and a battery 6.

The first camera 1 and the second camera 2 can function together to generate 3D images. The first camera 1 and the second camera 2 may be any type of 3D image capturing devices including 3D capturing devices configured to capture visible light and/or ultraviolet light. Preferably, the first and second cameras are near-infrared (NIR) cameras.

Accordingly, the apparatus 100 contains the first and second cameras 1, 2 that are utilized in producing 3D images of a scene. Each of the first camera 1 and the second camera 2 is equipped with a housing designed to hold a single- or multi-part lens and an optical filter. The single- or multi-part lens in each housing is designed to capture and focus light reflected by the scene onto the imaging sensor of each of the first and second cameras.

Additionally, the optical filter is preferably designed to admit or allow to pass through a designed spectrum of wavelengths through the optical filter and onto an imaging plane. The first and second cameras are, preferably, designed to have similar optical properties (e.g., same diffractive and/or optical elements used in imaging). Additionally, and/or alternatively, the first and second cameras 1, 2 are configured so that they may be substantially simultaneously triggered or initiated to capture light over substantially similar exposure intervals.

Figure 2:
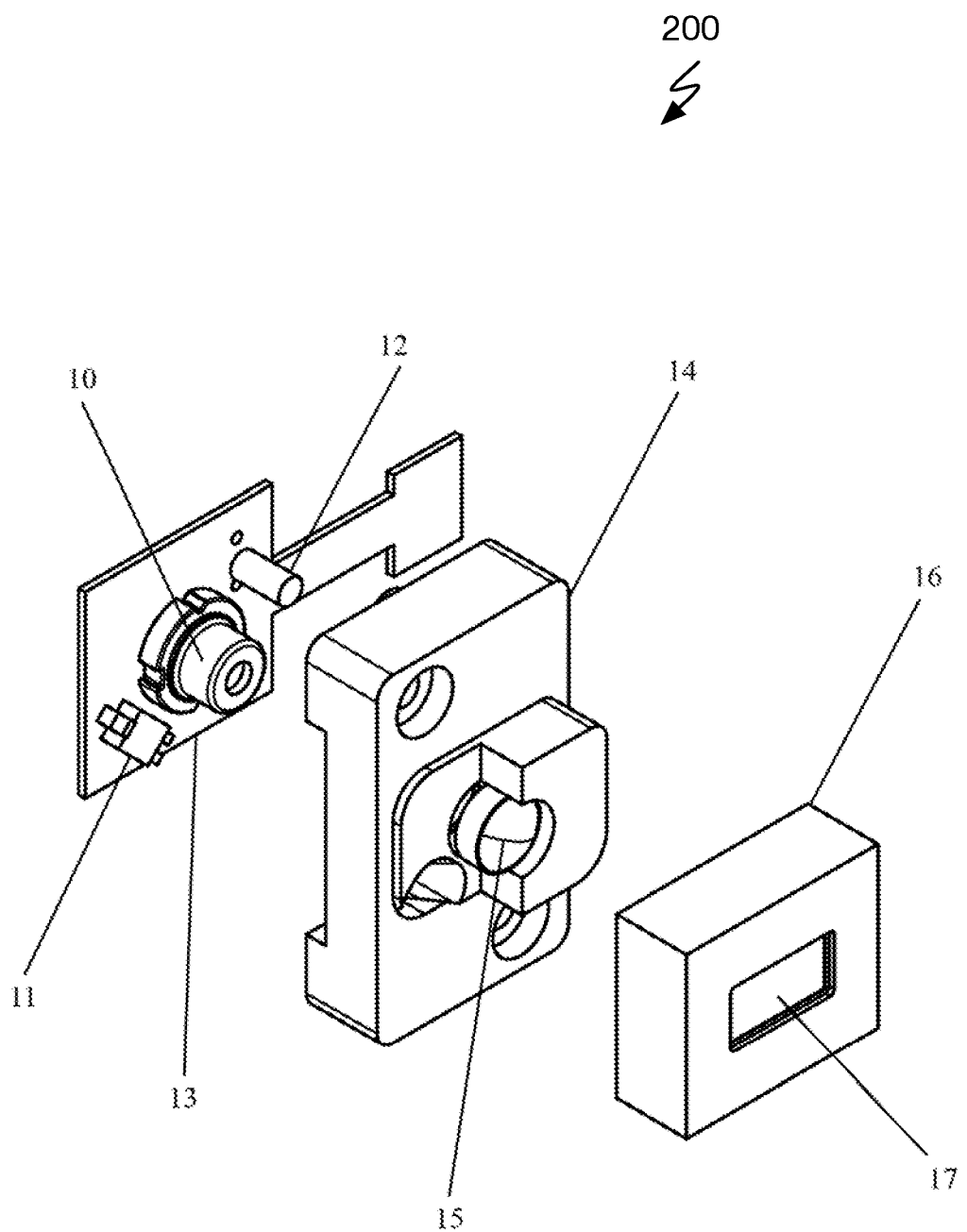
FIG. 2 illustrates a schematic of a projector subassembly in accordance with some embodiments of the present application.
Figure 3:
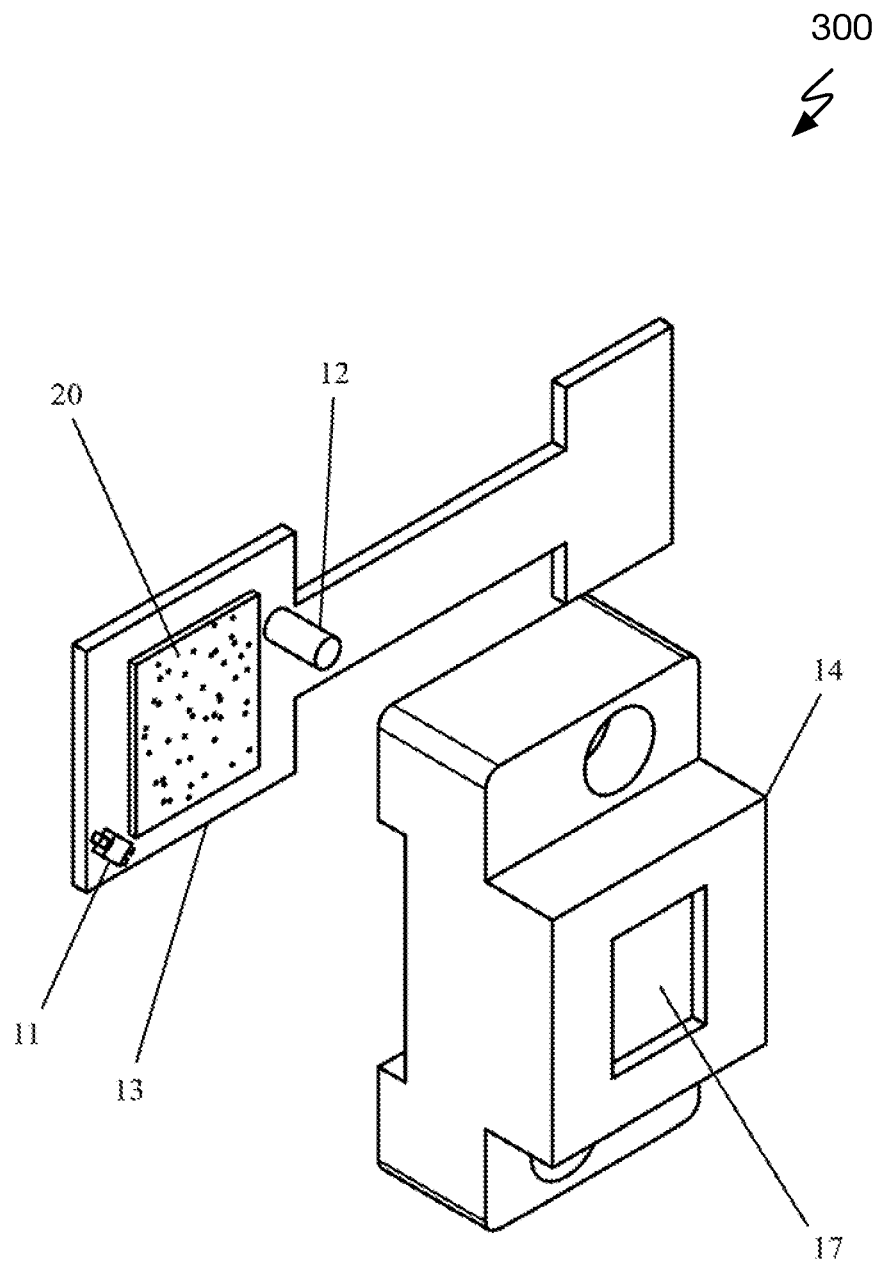
FIG. 3 illustrates a schematic of another projector subassembly in accordance with some embodiments of the present application.

The apparatus 100 preferably contains a projector subassembly, such as shown in FIG. 2 or FIG. 3, that projects a pre-determined pattern of light onto a scene in front of the apparatus 100 that forms at least part of an image being captured thereby. In some embodiments of the present application, the projector 3 is mounted so that the central axis of any light that is projected from the projector is projected down an optical axis substantially parallel to the optical axes of the first and second cameras utilized to produce 3D images. Additionally, and/or alternatively, the projector 3 is mounted such that the (optical design) focal point of the projector 3 is positioned to be substantially collinear with the focal points of the first and second cameras utilized to produce 3D images, and the axis upon which the projector 3 focal point and camera focal points lie is substantially parallel to the imaging planes of the first and second cameras.

Preferably, the apparatus 100 also contains an additional camera 5 for capturing visible light in a scene. Additionally, the camera 5 may be equipped with a housing designed to hold a single- or multi-part lens. Preferably, the lens is a wide vision lens, producing a horizontal image field of view exceeding 90 degrees. In some embodiments of the present application, the camera 5 is mounted such that the optical axis of the camera 5 is substantially parallel to the optical axes of the first and second cameras utilized to produce 3D images. In some embodiments of the present application, the focal point of the camera is positioned to be substantially collinear with the focal points of the first and second cameras utilized to produce 3D images, and the axis upon which the visible light camera 5 and first and second 3D sensing cameras focal points lie is substantially parallel to the imaging planes of the first and second cameras utilized to produce 3D images.

In a preferred embodiment, the apparatus 100 contains one or more processors. For instance, the one or more processors may be general purpose computing processors and/or graphics computing processors. Preferably, the one or more processors control the first and second 3D and visible light cameras and projector 3 such that, at least, the first and second cameras are substantially simultaneously triggered or initiated to collect light, and the projector 3 illuminates an imaging scene while the first and second cameras are capturing light. Accordingly, when the one or more processors trigger the first and second cameras it causes both cameras to begin to operate to capture light (e.g., imaging) at a same time or very close (e.g., substantially) to a same time (e.g., within 0-10 millisecond of each other).

Additionally, in some embodiments of the present application, the one or more processors convert the images captured by the cameras into depth images using one or more methods described herein below, then transmit the depth images to a host computer external to the apparatus 100. Additionally, and/or alternatively, the one or more processors transmit the captured images to a host computer external to the apparatus 100, then the host computing processor converts the captured images into depth images using one or more methods described herein.

In the embodiments of the present application, there are provided several methods for producing depth images captured utilizing the apparatus 100. In each embodiment, the depth images are computed from the images captured by first and second cameras, acting as a pair for 3D sensing. Each of the depth sensing methods may passively or actively rely on the pattern projected onto the imaging scene by the projector 3.

In the passive methods of relying on the projected pattern, the projected pattern enhances the computation of depth by enhancing or increasing the likelihood that image regions in the captured images will be locally unique. Additionally, the passive methods, preferably, do not require projected patterns and may function when the projector 3 is disabled. However, the projector 3 may enhance the performance of the passive methods so that activating the projector 3 is a preferred manner of operation. By contrast, in one or more of the active methods, the projected pattern may be expressly required for depth to be computed from captured imagery.

Preferably, the methods utilize subroutines, executed in a pipeline, to correct errors present in the captured images, align the images, and enhance image region matching between the images.

Preferably, a set of subroutines are executed in a pipeline to correct errors present in the images captured by the first and second cameras (including, sometimes, the visible light camera) and align the images thereof.

Accordingly, as a first step in the pipeline, an optical distortion of each camera may be corrected based on parameters obtained in a camera calibration procedure during a manufacturing or a setup of the camera. In such optical distortion correction, current optical parameters (e.g., current calibration) of the camera may be compared to initial optical parameters (e.g., initial calibration) to determine a distortion amount (e.g., a difference between initial calibration and current calibration). Once the distortion amount is determined, the optical parameters of the camera may be adjusted or re-calibrated by the distortion amount to return the camera to or near the initial optical parameters.

The distortion model comprises radial distortion, tangential distortion, and the calibrated image center. Second, the images captured by the cameras are also rectified such that a point in one image corresponds to a substantially horizontal epipolar line in the second image. Third, dark image bias is removed by subtracting the per-pixel bias obtained by averaging imagery from a dark room. Fourth, lens shading is removed by subtracting bias observed by imaging a calibration target. Thus, all or some of these image error correction may be performed to the images captured by the cameras.

Preferably, a subroutine is executed by one or more of the processors to enhance the image region matching between each of the two images captured by the respective cameras when the image regions correspond to substantially identical scene locations in front of the 3D sensing apparatus 100. In some embodiments of the present application, the images are enhanced by subtracting the average pixel intensity value in a region and normalizing by the standard deviation. In such embodiments, the enhancements are conducted across regions of the image in parallel on a graphics processor (GPU). Additionally, and/or alternatively, the images are enhanced via a sliding window evaluation of a Multi-Layer Perceptron (MLP) neural network. The MLP neural network may be a feedforward artificial neural network model that maps sets of input data onto a set of appropriate outputs. Thus, an MLP may consist of multiple layers of nodes in a directed graph, with each layer fully connected to the next one. The MLP neural network has many input neurons, each input neuron corresponding to a pixel in the evaluation region; one output neuron for the enhanced value of the central pixel; and many layers of hidden neurons. The hidden neurons utilize a Rectified Linear Unit (Relu) or Sigmoid (Sig) activation function. The end-to-end MLP neural network is trained by providing a target image and several (possibly millions) of image patches with synthetically generated noise. The training is via gradient descent minimization on a cost function comparing the output of the MLP neural network with the target image for several image patches with synthetically generated noise. Preferably, the training of the MLP neural network also refines the training image by introducing additive bias neurons for each pixel of the training image as an additional input layer, and jointly minimizing the additive terms of these bias neurons via back propagation to this first layer during gradient descent minimization.

2. Depth Sensing Method (Active Stereo)

Figure 4:
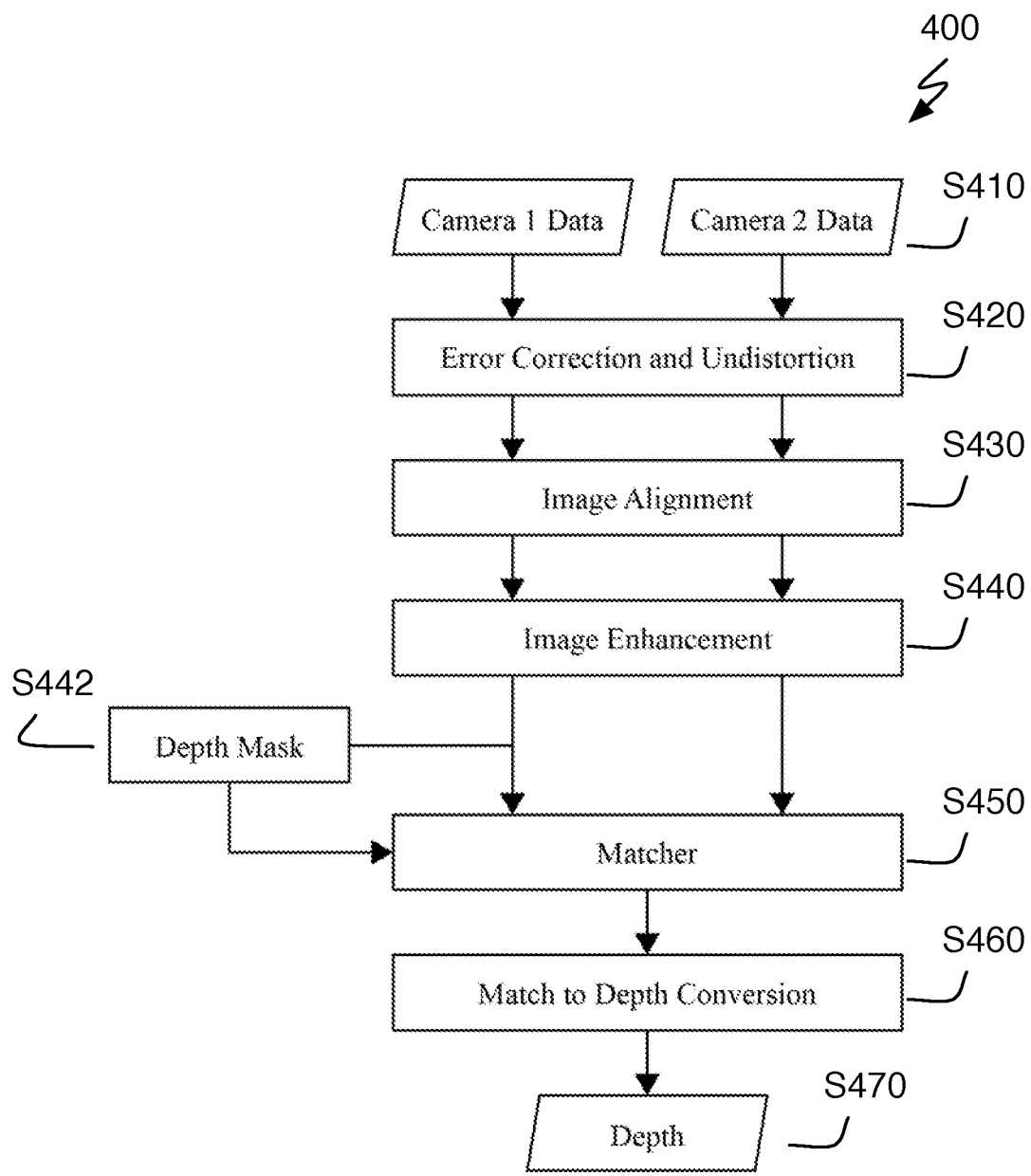
FIG. 4 illustrates a process flow of a method for three-dimensional sensing in accordance with some embodiments of the present application.

FIG. 4 illustrates a process flow method 400 for 3D sensing. Preferably, the process flow of method 400 is implemented by the apparatus 100, however, the process flow of method 400 may be implemented by any suitable apparatus. The method 400 generally includes S410 for capturing images, S420 for error correction and undistortion, S430 for image alignment, S440 for image enhancement, optionally S442 for depth masking, S450 for matching pixels, S460 for matching to depth conversion, and S470 for generating depth images.

Accordingly, at S410, a pair of images is captured by a first camera and a second camera which are utilized for 3D sensing. For instance, the first and the second cameras may be two near-infrared cameras. Preferably, subroutines described above are applied to correct errors present in the captured images, align the images, and enhance image region matching between the images. Preferably, at S442, a depth sensing mask is computed, based on the local image region salience, which specifies which pixels in a first image depth will be computed for. Then, for each specified point in the first image, the region around the specified point is matched, at S450, to image regions in the second image surrounding each of many candidate match points. The point in the second image with the lowest matching error is taken to be the matching point to the point in the first image at S460. Finally, at S470, a subroutine is executed which computes the depth for the location of the point in the first image based on the location of the point in the first image and the location of its match in the second image.

Accordingly, S430-470 can be considered steps required for performing depth sensing with active stereo.

The error correction and undistortion of S420 may include any number of error correction schemes and undistortion methods, such as camera calibration, image rectification, dark image bias, and lens shading. Additionally, and/or alternatively, the process flow of method 400 may also include S422 (not shown) for image enhancement. It shall be noted that both error correction and undistortion can be performed in combination (e.g., simultaneously and/or sequentially).

3A. Dual Baseline Structured Light Apparatus

Referring to FIG. 1, FIG. 1 also illustrates an apparatus 100 having a dual baseline structure.

In preferred embodiment, the first camera 1 and the second camera 2 are positioned such that the projector 3 is positioned between them. While, in some embodiments the projector may typically be positioned equidistant to each of the first and second camera, in a preferred dual baseline structure, one of the first and second camera is closer to the projector 3 than the other of the first and second camera. In such preferred embodiment, the projector 3 may be adjustable along the baseline to thereby modify the imaging field of viewing capabilities of the first and second camera.

Each of the two cameras may range in distance from the projector. For instance, each camera may be a distance in the range of 5 cm to 30 cm from the projector. When the projector 3 is relatively close to one of the two cameras, this positioning of the projector reduces shadows in the imaging of the camera that is closest to the projector 3. This configuration is preferred in a circumstance in which a depth of a subject or object of imaging is close to the apparatus 100.

Additionally, and/or alternatively the projector 3 may be operatively controlled or coupled to a motor that is able to move the projector 3 along the baseline. In some embodiments, based on a distance of a subject or an imaging scene, the motor may be triggered to move along the baseline to thereby change the distance of the projector 3 from each of the first camera and the second camera. In this way, at least, one of the two cameras is able to capture a much higher quality image of an object, subject, or other elements of a scene.

Alternatively, in some embodiments, the projector 3 may not be positioned between the two cameras but rather at a position external to the two cameras or only at a side of one of the two cameras. Accordingly, in such a configuration, the two 3 cameras may be positioned toward one side of the projector 3.

3B. Dual Baseline Structured Light Depth Sensing Method

Figure 5:
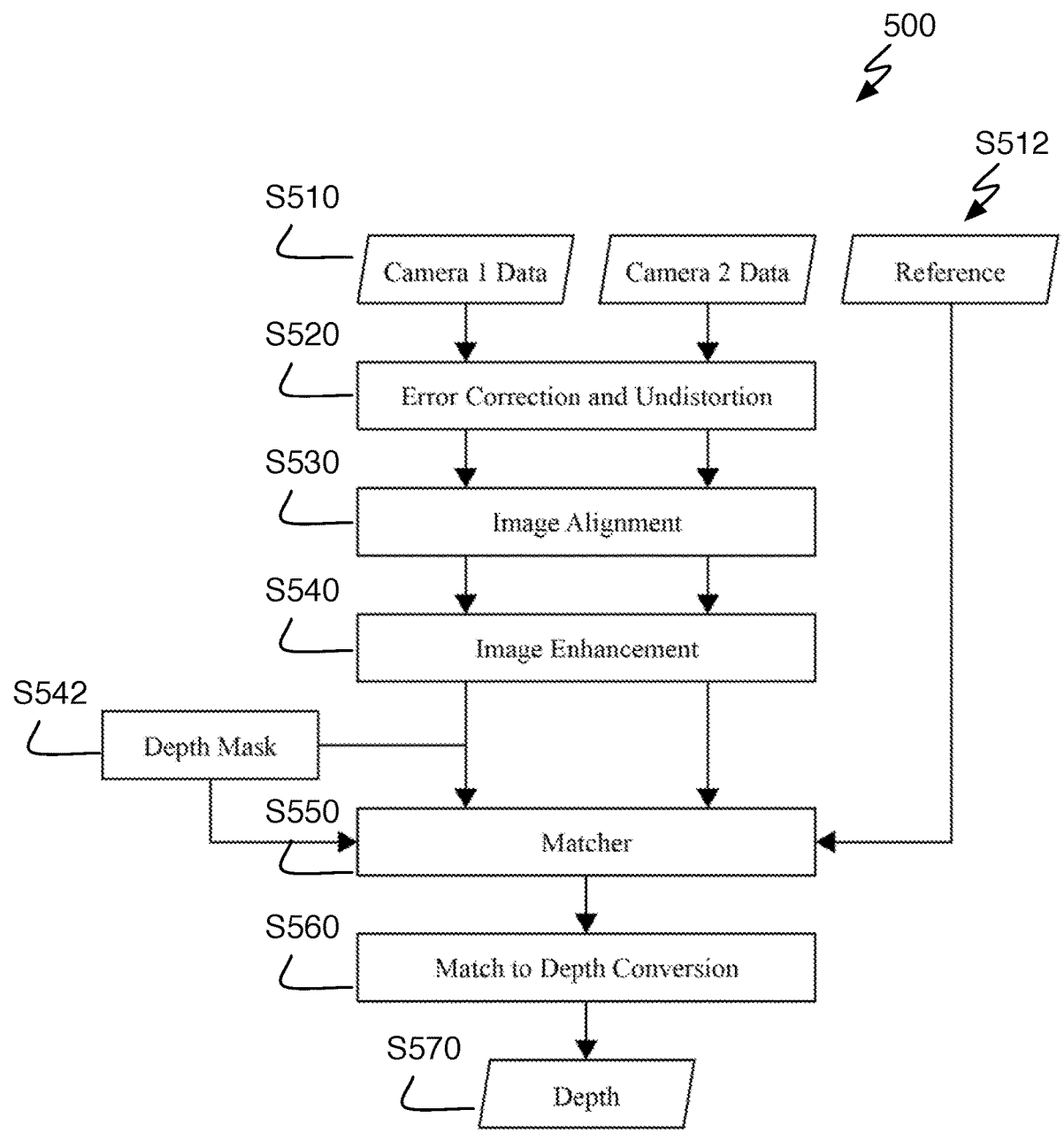
FIG. 5 illustrates a process flow of another method for three-dimensional sensing in accordance with some embodiments of the present application.

As illustrated in FIG. 5, a process flow of a method 500 for 3D sensing is provided. In particular, the process flow of method 500 functions to utilize a dual baseline configuration to capture images. In the method 500, S510 is implemented for capturing images using the two cameras, S512 is implemented for identifying a reference image, S520 is implemented for error correction and undistortion, S530 for image alignment, S540 for image enhancement, optionally S542 for depth masking, S550 for matching pixels, S560 for matching to depth conversion, and S570 for generating depth images.

Accordingly, at S510, a pair of images is captured by a first camera and a second camera which are utilized for 3D sensing. For instance, the first and the second cameras may be two near-infrared cameras. Preferably, subroutines described above are applied to correct errors present in the captured images, align the images, and enhance image region matching between the images. Preferably, at S542, a depth sensing mask is computed, based on the local image region salience, which specifies which pixels in a first image depth will be computed for. At S512, a pre-captured image reference image of the projected pattern is also captured or identified such that given the location of a point in the scene for the first and second image, the point of the location's received pattern within the reference image can be computed using a mathematical function that relies on the geometric and optical properties of the mapping apparatus and the geometry of the scene when the reference image was captured. Then, for each specified point in the first image, the region around the specified point is matched, at S550, to image regions in the second image surrounding each of many candidate match points. The point in the second image with the lowest matching error is taken to be the matching point to the point in the first image at S560. Finally, at S570, a subroutine is executed which computes the depth for the location of the point in the first image based on the location of the point in the first image and the location of its match in the second image. Alternatively, a subroutine may be executed which computes the depth for the location of the point in the first image as a function the location in the first image and the location in the reference image, or as a function of all three locations.

Accordingly, S530-570 can be considered steps required for performing depth sensing with active stereo.

The error correction and undistortion of S520 may include any number of error correction schemes and undistortion methods, such as camera calibration, image rectification, dark image bias, and lens shading. Additionally, and/or alternatively, the process flow of method 500 may also include S522 (not shown) for image enhancement. It shall be noted that both error correction and undistortion can be performed in combination (e.g., simultaneously and/or sequentially).

4. Dual Baseline Structured Light Switching Depth Sensing Method

Figure 6:
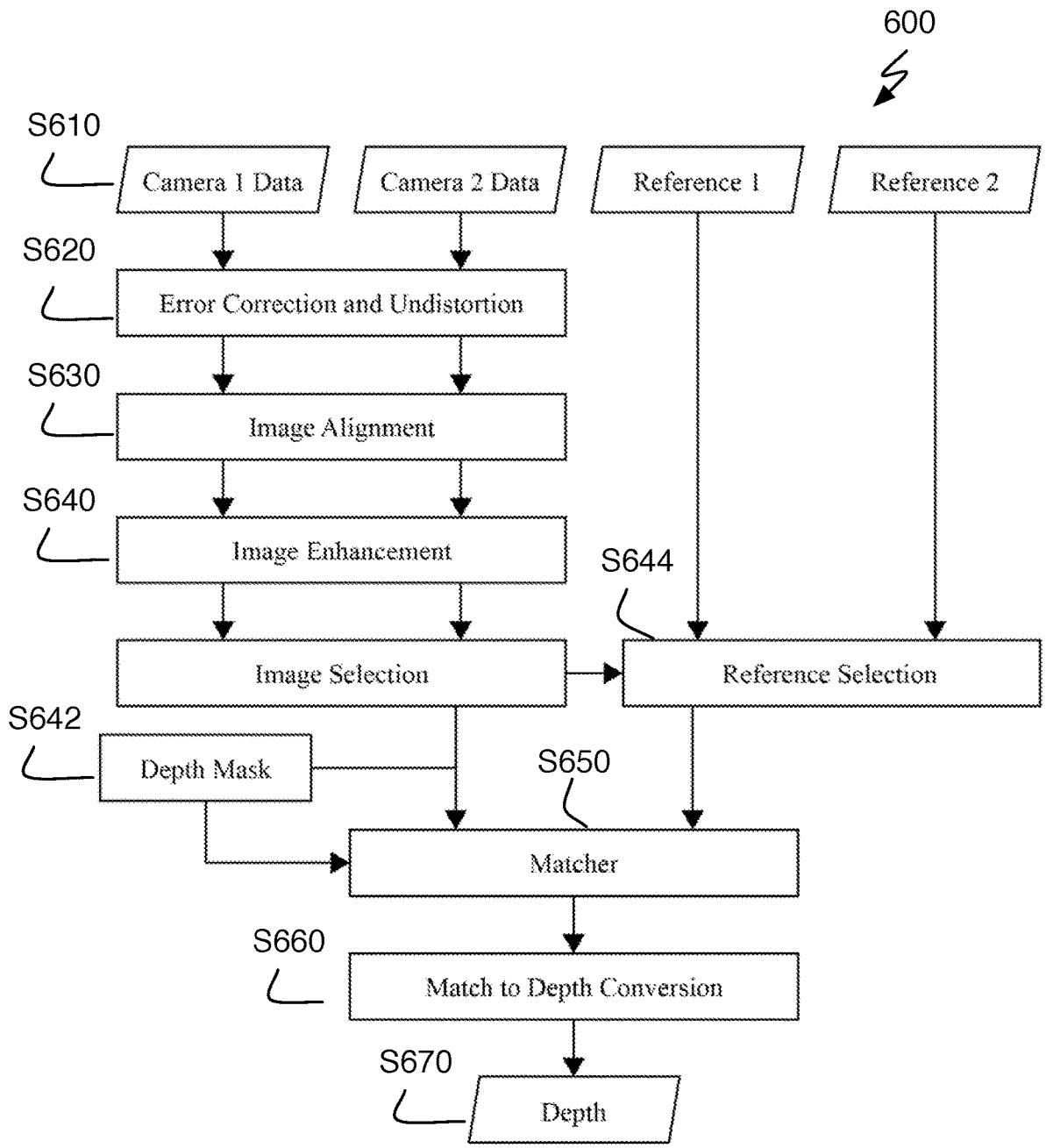
FIG. 6 illustrates a process flow of yet another a method for three-dimensional sensing in accordance with some embodiments of the present application.

As illustrated in FIG. 6, a process flow of a method 600 for 3D sensing is provided. In particular, the process flow of method 600 functions to utilize a dual baseline configuration to capture images. In the method 600, S610 is implemented for capturing images using the two cameras, S612 is implemented for identifying at least two reference images, S620 is implemented for error correction and undistortion, S630 for image alignment, S640 for image enhancement, optionally S642 for depth masking and S644 for reference image selection, S650 for matching pixels, S660 for matching to depth conversion, and S670 for generating depth images.

Accordingly, at S610, a pair of images is captured by a first camera and a second camera which are utilized for 3D sensing. For instance, the first and the second cameras may be two near-infrared cameras. Preferably, subroutines described above are applied to correct errors present in the captured images, align the images, and enhance image region matching between the images.

Additionally, a subroutine may interchange the role of the first and second images, specifying the second image to be the first and vice versa. This determination is based on the estimated distance to the scene points to be imaged, such that most depth points that will be computed are obtained with respect to the optimal camera-projector baseline distance for this operating range.

Preferably, at S642, a depth sensing mask is computed, based on the local image region salience, which specifies which pixels in a first image depth will be computed for. At S612, a pre-captured image reference image is also captured or identified corresponding to each of the two cameras utilized for 3D sensing. The pre-captured reference image corresponding to the selected first image is also selected as the reference image for the method such that given the location of a point in the scene for the first and second image, the point of the location's received pattern within the selected reference image can be computed using a mathematical function that relies on the geometric and optical properties of the mapping apparatus and the geometry of the scene when the reference image was captured.

Then, for each specified point in the first image, the region around the specified point is matched, at S650, to image regions in the second image surrounding each of many candidate match points. The point in the second image with the lowest matching error is taken to be the matching point to the point in the first image at S560. Finally, at S670, a subroutine is executed which computes the depth for the location of the point in the first image based on the location of the point in the first image and the location of its match in the second image. Alternatively, a subroutine may be executed which computes the depth for the location of the point in the first image as a function the location in the first image and the location in the reference image, or as a function of all three locations.

Accordingly, S630-670 can be considered steps required for performing depth sensing with active stereo.

The error correction and undistortion of S620 may include any number of error correction schemes and undistortion methods, such as camera calibration, image rectification, dark image bias, and lens shading. Additionally, and/or alternatively, the process flow of method 600 may also include S622 (not shown) for image enhancement. It shall be noted that both error correction and undistortion can be performed in combination (e.g., simultaneously and/or sequentially).

The methods 400-600 described in correspondence with FIGS. 4-6, respectively, and along with the corresponding sections above may utilize a sub-method for matching between two to three images captured by the cameras, including the two cameras utilized for 3D sensing.

For instance, the matching cost function may be based on sum of absolute differences or normalized cross correlation. In the case where three images must be matched, the sum of two or three pairwise cost functions may be used, or a robust weighting between two or three pairwise cost functions may be used. The coefficients weighting the robust cost function are based on local image region salience, distance to the imaged scene, or previously computed depth image results.

In some embodiments, the matching cost function sub-method is implemented as a brute force matcher on a GPU, in which the image regions that are compared for each cost function evaluation are directly evaluated by the GPU. In another embodiment, partial evaluations of the cost function corresponding to rows in the images to be matched are evaluated on a central processing unit (CPU), then these partial evaluations are aggregated to compute evaluations for complete regions and re-used for multiple points in the first image.

Additionally, and/or alternatively, the cost function sub-method is implemented as a brute force matcher on a GPU, in which the image regions that are compared for each cost function evaluation are drawn from a lower-resolution copy of the captured images and directly evaluated by the GPU.

Additionally, and/or alternatively, the cost function sub-method is performed at a reduced resolution on a CPU, then the depth estimate is resampled to the native resolution and used to constrain the search range in the first or third embodiment.

4A. Dual Baseline Depth Sensing Method with ML Training

Figure 7:
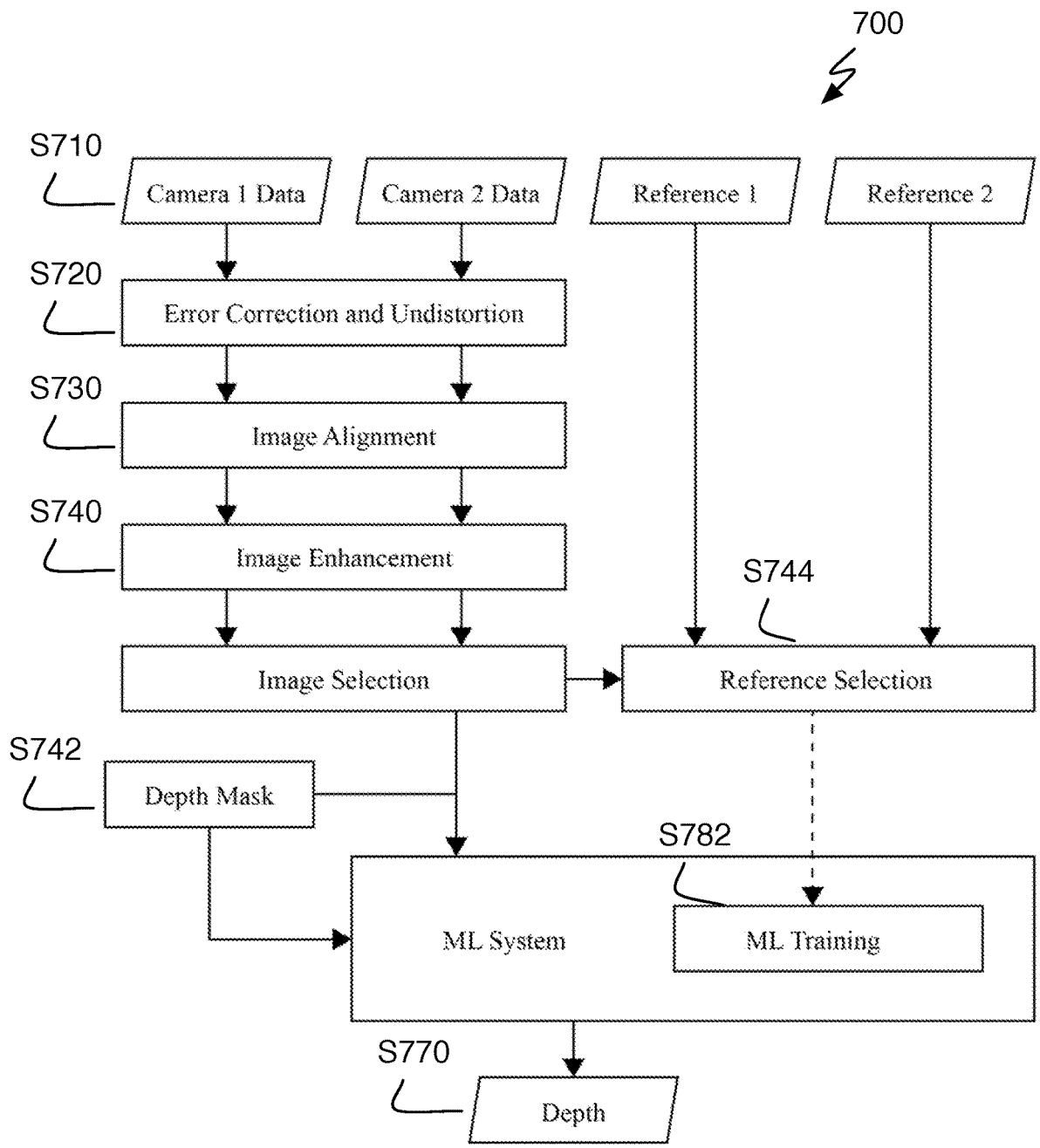
FIG. 7 illustrates a process flow of a further method for three-dimensional sensing in accordance with some embodiments of the present application.

As illustrated in FIG. 7, a process flow of a method 700 for 3D sensing is provided. In particular, the process flow of method 700 functions to utilize a dual baseline configuration to capture images. In the method 700, S710 is implemented for capturing images using the two cameras, S712 is implemented for identifying at least two reference images, S720 is implemented for error correction and undistortion, S730 for image alignment, S740 for image enhancement, optionally S742 for depth masking and S744 for reference image selection, S750 for matching pixels, S760 for matching to depth conversion, S770 for generating depth images, and S782 for machine training.

Accordingly, at S710, a pair of images is captured by a first camera and a second camera which are utilized for 3D sensing. For instance, the first and the second cameras may be two near-infrared cameras. Preferably, subroutines described above are applied to correct errors present in the captured images, align the images, and enhance image region matching between the images.

Additionally, a subroutine may interchange the role of the first and second images, specifying the second image to be the first and vice versa. This determination is based on the estimated distance to the scene points to be imaged, such that most depth points that will be computed are obtained with respect to the optimal camera-projector baseline distance for this operating range.

Preferably, at S742, a depth sensing mask is computed, based on the local image region salience, which specifies which pixels in a first image depth will be computed for. At S712, a pre-captured image reference image is also captured or identified corresponding to each of the two cameras utilized for 3D sensing. The pre-captured reference image corresponding to the selected first image is also selected as the reference image for the method such that given the location of a point in the scene for the first and second image, the point of the location's received pattern within the selected reference image can be computed using a mathematical function that relies on the geometric and optical properties of the mapping apparatus and the geometry of the scene when the reference image was captured.

Then, for each specified point in the first image, the region around the specified point is fed to a machine learning (ML) system 780 that has been trained on the selected reference image. AT S782, The ML system 780 processes the image region to produce a depth value for the specified point. Preferably, the ML system 780 also produces a two-parameter normal vector estimate at the specified point.

In some embodiments, the ML system 708 utilizes a random forest subsystem followed by a depth assignment subsystem. The random forest subsystem is trained to discriminate different image regions from all rows of the image. This training is carried out by maximizing the information gain of splitting criteria for image regions drawn randomly from the various rows of the reference image. The random forest subsystem produces a set of leaf assignments for each image patch it is queried with, with one leaf assignment corresponding to each random tree in the random decision forest. The leaf assignments are combined in a leaf assignment vector, and this leaf assignment vector, along with the location of the point in the first image from which the image region was extracted, is used to query the depth assignment subsystem. The depth assignment subsystem returns a depth and normal vector based on the empirical distribution of depth and normal vector values for this leaf value assignment over the training data set. The depth assignment subsystem computes a set of these empirical distributions for each row of the reference image.

Additionally, and/or alternatively, the depth assignment subsystem directly regresses a depth value for the leaf assignment vector and image query location. The regressor may be a linear regressor, a kernelized linear regressor, or a Multi-Layer Perceptron neural network.

Additionally, in some embodiments, the ML system 780 is a convolutional neural network (CNN). The CNN is trained to estimate the depth and normal vector directly from the query image patch. The CNN uses layers of convolutional filter neurons, max pooling neurons, and perceptron neurons. The CNN is trained over a labeled data set wherein the training features are image regions of the reference image, perturbed with synthetic noise, and the labels are depth and normal vector values. Training is carried out by minimizing the error in the estimated depth and normal vector values via gradient descent. At run time, the CNN is evaluated on the received first image in a sliding window fashion, providing depth values and normal vectors for each pixel of the received image.

In some embodiments, the ML system 780 is a Multi-Layer Perceptron (MLP) neural network. The MLP is trained to estimate the depth and normal vector directly from the query image patch. The MLP uses layers of perceptrons using the ReLu and Sig activation functions. The MLP is trained over a labeled data set wherein the training features are image regions of the reference image, perturbed with synthetic noise, and the labels are depth and normal vector values. Training is carried out by minimizing the error in the estimated depth and normal vector values via gradient descent. At run time, the MLP is evaluated on the received first image in a sliding window fashion, providing depth values and normal vectors for each pixel of the received image.

In both neural network embodiments, subsections of the neural network topology may be evaluated on multiple rows of the image, enhancing runtime. On the other hand, subsections of the neural network topology may be evaluated for only one row of the image, or for subsections of single rows. For subsections that are evaluated on multiple rows, the average of the gradients of the row-independent subsections are used for back propagation during gradient descent. Alternatively, the subsections may be back propagated independently, with one copy of the subsection for each row, and then the weights of these copies are averaged together to produce the weights to be re-used on multiple rows.

Accordingly, S730-780 can be considered steps required for performing depth sensing with active stereo.

The error correction and undistortion of S720 may include any number of error correction schemes and undistortion methods, such as camera calibration, image rectification, dark image bias, and lens shading. Additionally, and/or alternatively, the process flow of method 700 may also include S722 (not shown) for image enhancement. It shall be noted that both error correction and undistortion can be performed in combination (e.g., simultaneously and/or sequentially).

5. Method of Mapping to Reduce Power Consumption

Figure 9:
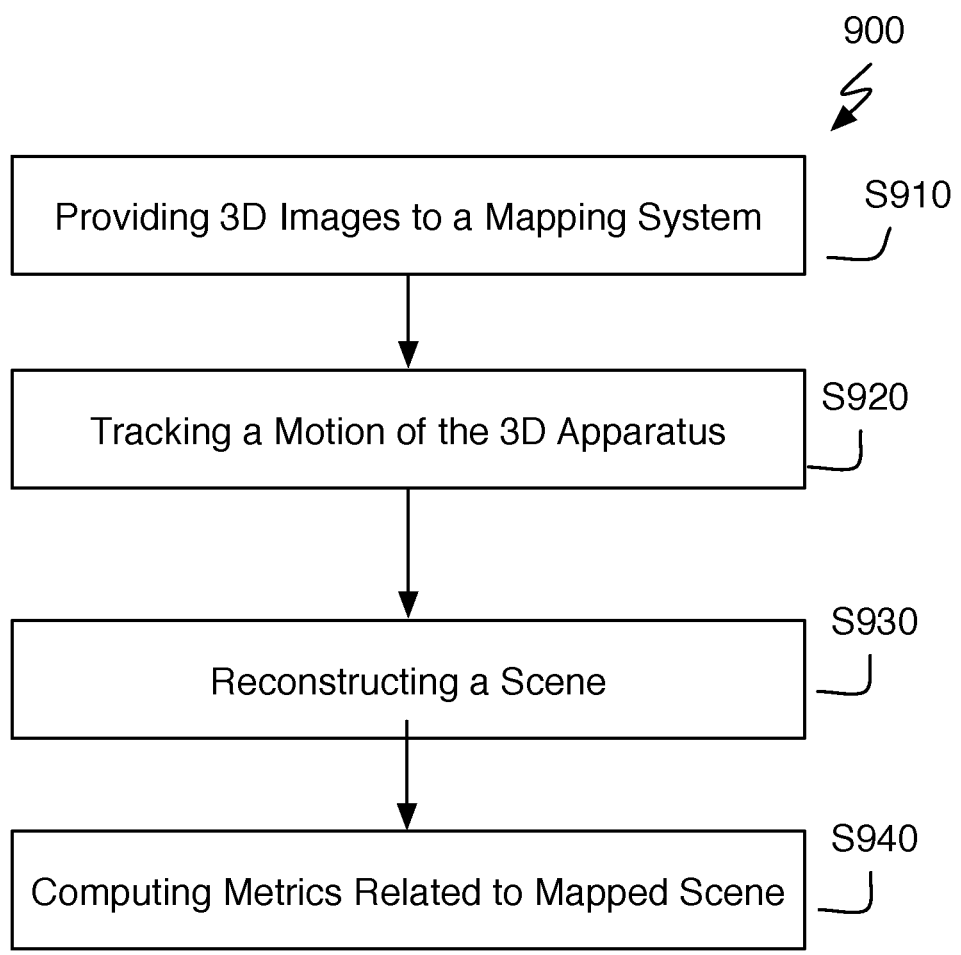
FIG. 9 illustrates a process flow of a method for power reduction when three-dimensional sensing in accordance with some embodiments of the present application.

As shown in FIG. 9, a process flow of a method 900 for power reduction when 3D sensing is provided. Such process flow is preferably performed using a mobile device. The method 900, preferably, includes providing 3D images to a mapping subsystem at S910, tracking a motion of the 3D apparatus at S920, reconstructing a scene at S930, and computing one or more measures/metrics related to the quality of a mapped scene at S940.

At S910 of method 900, 3D images or depth streams produced by the 3D sensing apparatus 100 are provided to a 3D mapping subsystem. The 3D mapping subsystem relies on the 3D images, together with measurements from an inertial measurement unit (IMU) to substantially simultaneously track, at S920, the motion of the 3D sensing apparatus 100, at S930 reconstruct the scene the apparatus 100 is directed toward, and at S940 compute measures of (1) reconstructed scene completeness, (2) reconstructed scene coverage, (3) reconstructed scene closeness, and (4) the number of new depth images produced per second.

Items (1-4) are passed to a control subsystem that enacts one of the following policies to conserve power: (A) throttling the capture and illumination duty cycle of the cameras and projector respectively, (B) indicating to the processor not to process the captured images into 3d images, (C) reducing projector emission power when the reconstructed scene is close to the 3d mapping apparatus, (D) skip frames, (E) reducing projector illumination duty cycle when the computing processor cannot produce depth frames at a same rate or when depth sensing is failing.

The basis for power reduction or conservation may be made on any one or more of the computed metrics related to the quality of the mapped scene. Thus, any of the one or more items (A)-(E) may be combined to determine an appropriate metric for conserving power according to method 900. Additionally, any of the one or more methods disclosed in application Ser. No. 14/216,010 may be used, the entirety of this application is incorporated in its entirety by this reference.

6. A Projector with Laser Apparatus

Referring to FIG. 2, FIG. 2 illustrates an apparatus 200 that may be used in combination with the 3D sensing apparatus 100 to capture images. In particular, apparatus 200 in combination with apparatus 100 function to project a pre-designed pattern onto a scene to be captured. In a preferred embodiment, the apparatus 200 comprises a projector subassembly. Generally, the apparatus 200 includes a laser diode 10, a photodiode 11, a thermistor 12, a printed circuit board 13, a housing 14, a collimator 15, a metal cap 16, and a diffractive optical element (DOE) 17.

In some embodiments, the projector 200 utilizes a laser diode 10 to emit light. Specifically, the laser diode 10 is designed to emit light with a specific spectrum of wavelengths. In some embodiments, the light emitted from the laser diode 10 is emitted through a collimator 15, which collimates the light into a beam, and then through a diffractive optical element (DOE) 17, which produces a pattern of beams. Thus, the apparatus 200 may include both a collimator and one or more diffractive optical elements. Alternatively, the apparatus 200 may include a series of DOEs with at least two DOEs in which one DOE is used to collimate and the second to diffract. Alternatively, the apparatus 200 may include a single diffractive optical element that collimates and diffracts.

In some embodiments, light from the laser diode 10 passes through two DOE's 17, the first DOE collimating the light and the second DOE producing a pattern of beams. In a variant embodiment, the light from the laser diode 10 passes through a single DOE, which collimates and focuses the light, and produces the designed pattern. The projector contains a photodiode light sensor 11. The photodiode 11 captures light emitted by the laser diode 10 and outputs a signal indicating the projector emission power.

In one embodiment, the photodiode 11 is positioned so that its photoreceptor is pointed towards the laser diode emitter 10. In another embodiment, the photodiode is positioned away from the laser diode emitter 10, so that it collects light that is scattered and/or reflected by the projector housing or illuminated scene.

Accordingly, the photodiode 11 may be positioned in one or more of a plurality of positions to optimize image capture by the apparatus 100 using the projector subassembly of apparatus 200.

7. A Method of Producing a Projector with Laser

Figure 10:
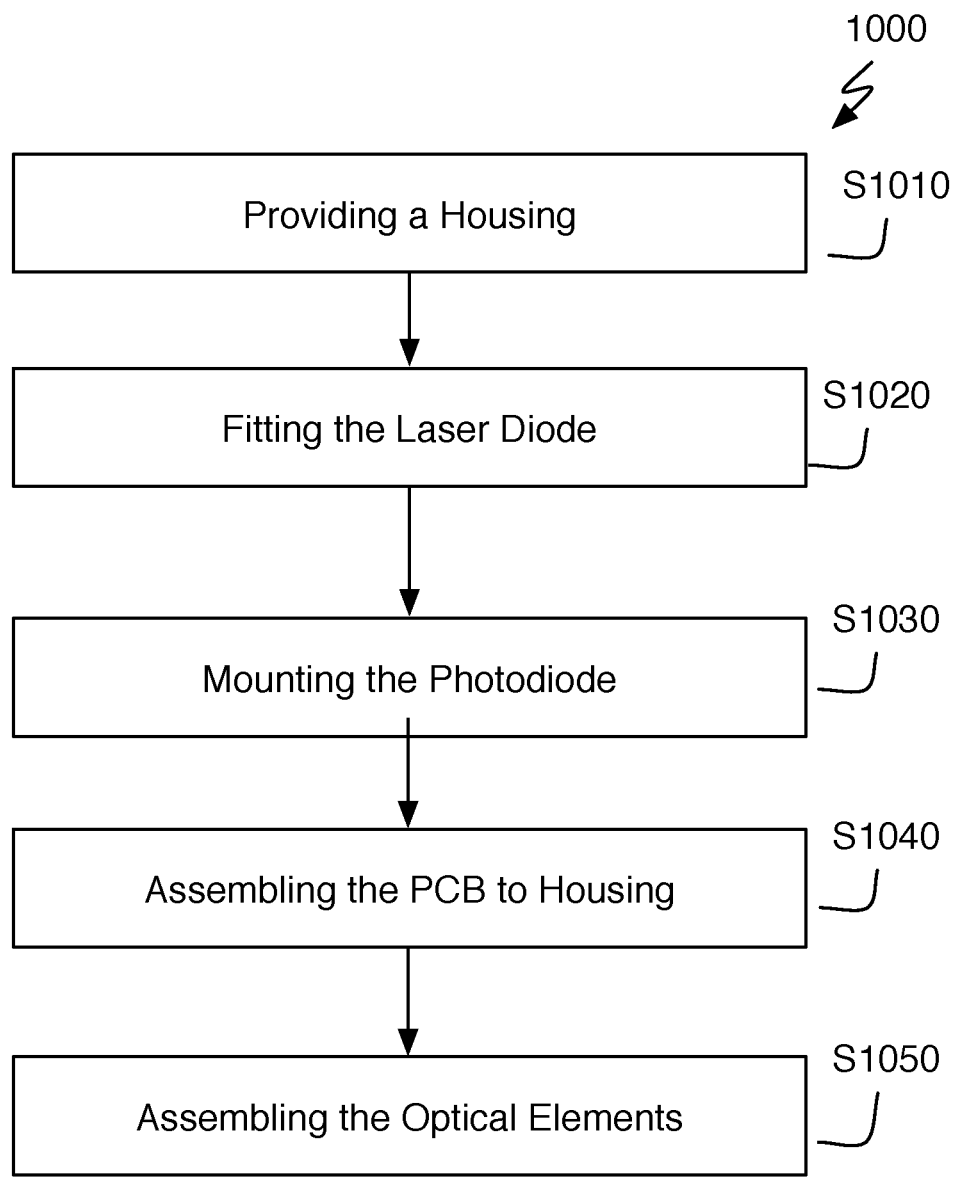
FIG. 10 illustrates a process flow of a method for producing a projector assembly in accordance with some embodiments of the present application.

As shown in FIG. 10, a process flow of a method 1000 for manufacturing a projector subassembly is provided. Specifically, the method 1000 functions to enable the manufacture of a laser diode projector is described herein below. The method 1000 generally includes S1010 for providing a housing, S1020 for fitting the laser diode to the housing, S1030 for mounting the photodiode to the printed circuit board, S1040 for assembling the PCB to the housing, and S1050 for assembling the optical elements into the housing.

At S1010, a housing is designed/provided and produced to accommodate the laser diode 10, the optical elements (e.g., collimator and DOEs, etc.), and the photodiode 11.

At S1020, the laser diode 10 may be press-fit into the housing 14 such that the laser diode 10 is immovably secured within the housing based on the pressure applied from the material surrounding one or more portions of the laser diode 10. While the laser diode 10 is generally press-fitted into the housing, the laser diode may be secured to the housing in any manner including mechanically attachment (e.g., using screws or the like), heat-pressed, melting, and the like.

At S1030, the photodiode 11 may be mounted to a rigid-flex printed circuit board (PCB) 13 through a surface mount technology (SMT) process. At S1040, the PCB 13 is then assembled onto the housing 14 such that 1) pins extending from the laser diode 10 can be soldered to the PCB 13, and 2) the photodiode fits into a receptacle in the housing 14.

At S1050, the optical elements may be assembled. Specifically, the optical elements, including DOEs and/or collimators, as described above, are inserted into a face of the housing 14, optionally utilizing an active alignment process to ensure consistency between manufactured laser diode projectors.

8. A Projector Apparatus with VCSEL Elements

Referring to FIG. 3, FIG. 3 illustrates an apparatus 300 that may be used in combination with the 3D sensing apparatus 100 to capture images. In particular, apparatus 300 in combination with apparatus 100 functions to project a pre-designed pattern onto a scene to be captured. In a preferred embodiment, the apparatus 200 comprises a projector subassembly having a vertical-cavity emitting laser (VCSEL). Generally, the apparatus 200 includes a photodiode 302, a thermistor 303, a printed circuit board 304, a housing 305, and a diffractive optical element (DOE) 306, and VCSEL 301.

As mentioned above, in a preferred embodiment, the projector subassembly 300 utilizes a vertical-cavity surface-emitting laser. The VCSEL 301 is an array of laser emitting elements arranged on a semiconductor substrate in a pre-designed pattern, the pre-designed pattern possibly differing from the desired projected pattern. In some embodiments, a projection lens is placed in the projector housing 305 to receive and focus the light pattern emitted by the VCSEL 301 onto an imaging scene.

In some embodiments, a DOE is placed in the projector housing 305 to diffract and focus the light emitted by the VCSEL 301 onto the scene as a pattern. In some embodiments, a DOE 306 is placed in the projector housing 305 to diffract and focus the light pattern emitted by the VCSEL 301 into multiple adjacent copies in the scene.

Additionally, and/or alternatively, the projector 300 contains a photodiode light sensor 302. The photodiode 302 is configured to capture light emitted by the laser diode 301 and outputs a signal indicating the projector emission power.

In some embodiments, the photodiode 302 is positioned so that its photoreceptor is pointed towards the laser diode emitter 301. In another embodiment, the photodiode 302 is positioned away from the laser diode emitter 301, so that it collects light that is scattered and/or reflected by the projector housing 305 or illuminated scene.

Accordingly, the photodiode 302 may be positioned in one or more of a plurality of positions to optimize image capture by the apparatus 100 using the projector subassembly of apparatus 300.

9. A Method of Producing a Projector with VCSEL Elements

Figure 11:
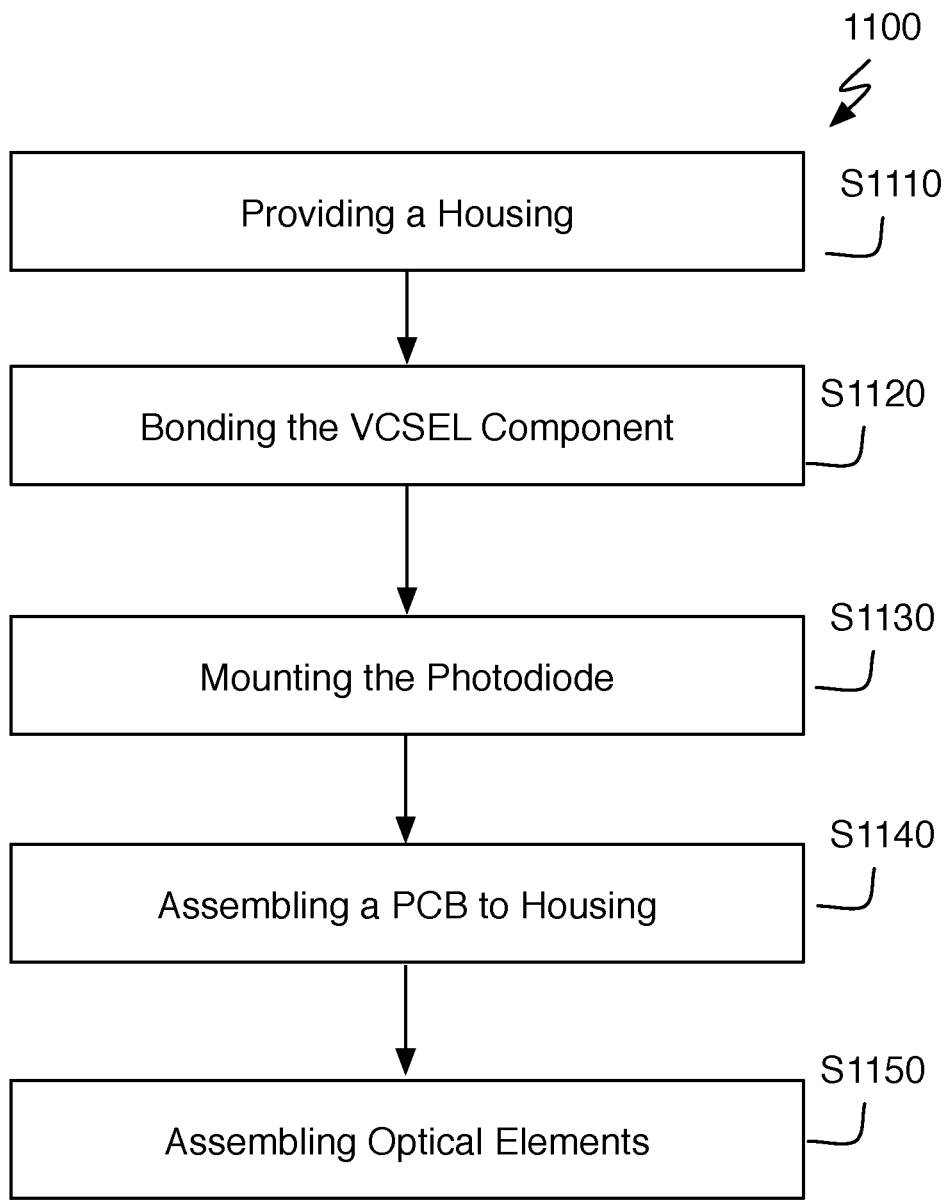
FIG. 11 illustrates a process flow of a method for producing another projector assembly in accordance with some embodiments of the present application.

As shown in FIG. 11, a process flow of a method 1100 for manufacturing a projector subassembly is provided. Specifically, the method 1100 functions to enable the manufacture of a VCSEL projector subassembly is described herein below. The method 1100 generally includes S1110 for providing a housing, S1120 for bonding the VCSEL to a component of the housing, optionally, S1130 for mounting the photodiode to the component of the housing, S1140 for assembling a PCB to the housing, and S1150 for assembling the optical elements into the housing.

At S1110, a housing is designed/provided and produced to accommodate the VCSEL 301, the optical elements (e.g., collimator and DOEs, etc.), and, optionally, the photodiode 302.

At S1120, the VCSEL 301 may be wire-bonded to a rigid-flex printed circuit board (PCB) such that the VCSEL 301 is immovably secured to the PCB 304. While the VCSEL 301 is generally wire-bonded, the VCSEL 301 may be secured to the PCB 304 in any manner including via mechanical attachment (e.g., flip chip—controlled collapse chip connection, thermosonic bonding, etc.) and the like.

At S1130, the photodiode 302 may optionally be mounted to the rigid-flex PCB 304 through a surface mount technology (SMT) process. At S1140, the PCB 304 bearing the VCSEL 301 is then assembled into the housing 305 and actively aligned, such that the VCSEL 301 and optionally, the photodiode 302, lie precisely at the center(s) of receptacles in the housing 305.

At S1150, the optical elements may be assembled. Specifically, the optical elements, including DOEs and/or collimators, as described above, are inserted into a face of the housing 305, optionally utilizing an active alignment process to ensure consistency between manufactured laser diode projectors.

10. A Method of Ensuring Eye Safety

Figure 8:
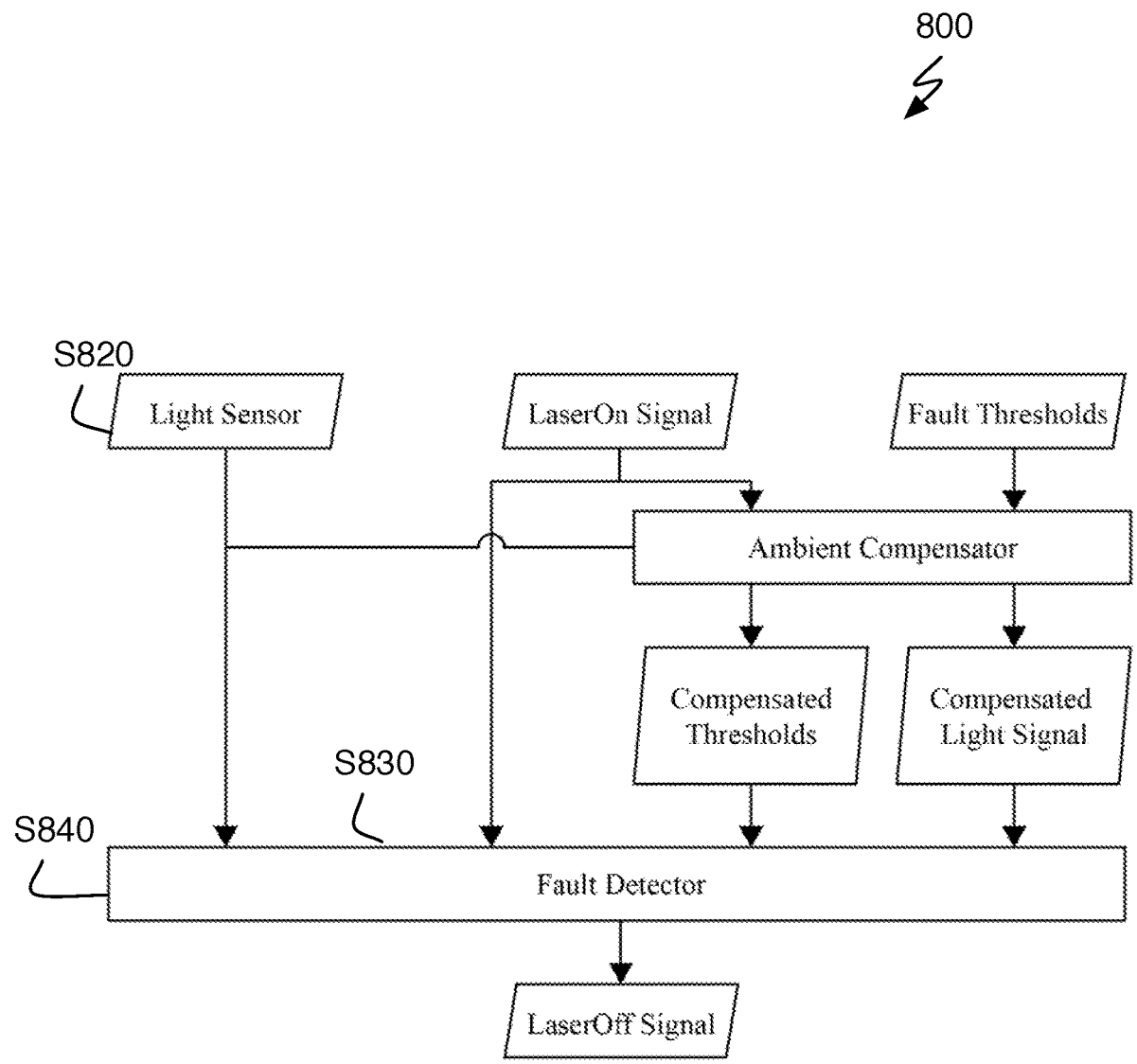
FIG. 8 illustrates a process flow of a method for controlling a three-dimensional projector in accordance with some embodiments of the present application.

As shown in FIG. 8, a process flow of a method 800 for monitoring a projector is provided. Specifically, method 800 functions to monitor power of a projector and ensure safety (e.g., eye safety) in use of the projector. Generally, the method 800 includes S810 (not shown) for capturing a projector power, S820 capturing an ambient light signal, S830 for identifying fault triggers, and S840 for modifying the projector.

Accordingly, a subsystem of a projector assembly or a 3D sensing apparatus, such as apparatus 100, may be used in implementing the method 800 for monitoring projector power and ensuring eye safety.

At S810, a signal from a photodiode, representative of projector illumination power, is captured. Additionally, a second signal, representative of ambient illumination is captured and stored. In some embodiments, this ambient light signal is captured from the same photodiode while the projector is not illuminated. In another embodiment, this ambient light signal is captured from a second photodiode external to the projector housing.

At S820, each of the ambient light signal, the projected light signal, and a signal indicating whether the projector is currently active are input into a fault detection subsystem. The fault detection subsystem detects whether the signals are outside of normal operating ranges due to broken optical elements, missing optical elements, abnormal laser operation, or proximity of the illuminated scene to the projector. Accordingly, the fault detection subsystem includes fault detection thresholds which may be used in a fault determination system. In particular, one or more values associated with the projector power signal, the ambient light signal, and on/off state signal of the projector may be compared to the fault detection threshold to determine whether a fault has occurred.

At S830, in some embodiments, for identifying one or more fault triggers or the like, the projected light signal is compensated by subtracting the ambient light signal, and then the several fault thresholds of the fault detection subsystem are checked. In another embodiment, several fault thresholds are adjusted as a function of the ambient light signal, and the projected light signal is checked against these adjusted fault thresholds. When the fault detection subsystem detects that one or more thresholds have been exceeded, it signals to shut down the projector. It shall be noted that it may be possible to combined the two above-noted fault detection processes including the process for compensating the projected light signal and adjusting the fault thresholds based on an amount of ambient light.

Thus, in the cases, when a fault is detected, the method at S840 is configured to modify the projector to ensure safety. Specifically, when it is determined that a fault has occurred, the projector may be immediately deactivated to prevent light from continuing to project from the projector. In this way, if there is a malfunction or broken component of the projector a user's safety may be ensured. Alternatively, a power to the projector may be deactivated, a cover to the projector may be automatically actuated (e.g., using a release mechanism combined with a spring, motorized actuator, etc.).

Additionally, and/or alternatively, a warning indicator may be provided to a user of the projector. The warning indicator may be provided in any manner including acoustically (e.g., a verbal warning), visually (e.g., a warning light or flashing of the projector), or a vibration of the projector or the apparatus housing the projector. Any one or combination of these warning methods may be implemented to ensure safety of a user or the like.

11. Projector Temperature Regulation Method

Figure 12:
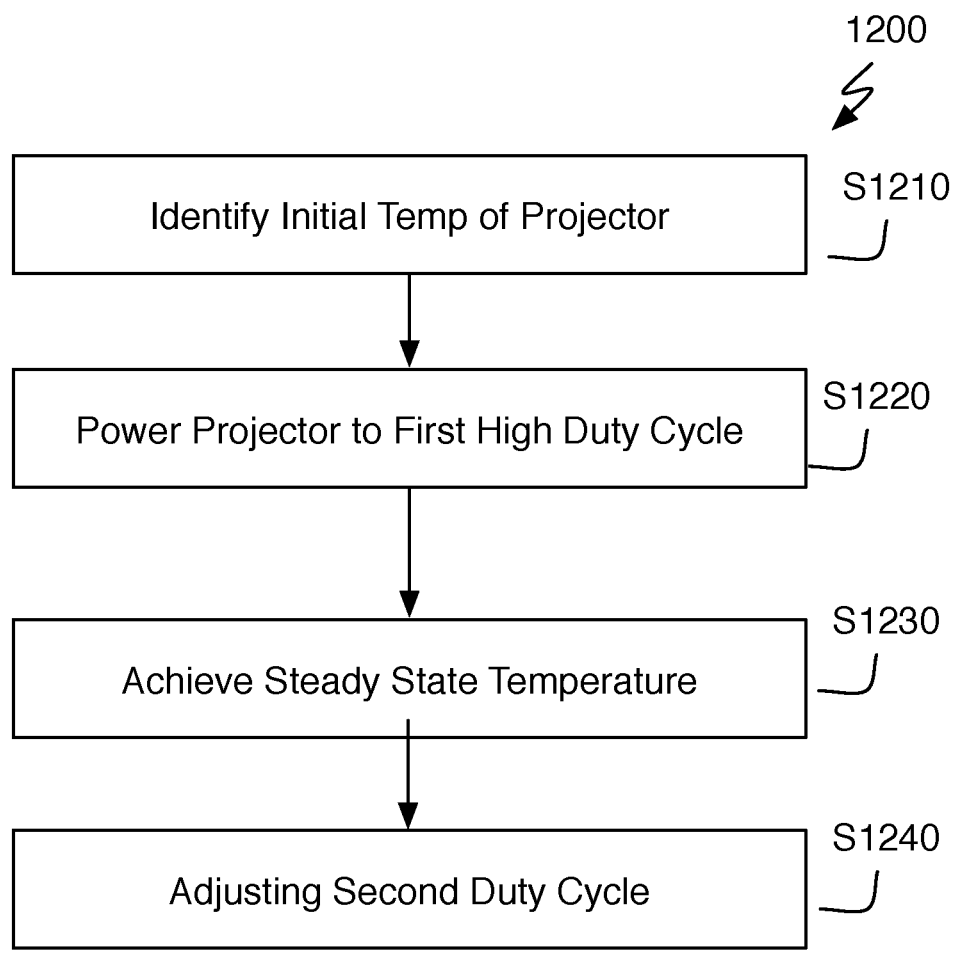
FIG. 12 illustrates a process flow of a method for regulating a temperature of a projector in accordance with some embodiments of the present application.

As shown in FIG. 12, a process flow of a method 1200 for projector temperature regulation is provided. Specifically, the method 1200 functions to identify a temperature of a projector and regulate the same.

Preferably, a method for rapidly powering on the projector is utilized if it is desirable to operate the projector at less than 100% power duty cycle. The projector is powered at higher than the desired duty cycle until the projector temperature and the projector temperature rate of change are detected to fall within predetermined levels. Then duty cycle is reduced to the desired level.

Accordingly, at S1210, an initial temperature of a projector is identified. The temperature of the projector may be determined in any number including using a temperature/heat sensor that may be operably coupled to the projector or otherwise, sufficiently in proximity of the projector to obtain a temperature thereof.

At S1220, a power signal is provided to power the projector to a first high duty cycle exceeding a desired duty cycle corresponding to a desired temperature of the projector. Thus, by providing a duty cycle higher than a higher duty cycle, a desired temperature of the projector may be more readily achieved. The power signal for powering the projector to the first high duty cycle is provided only for a predetermined or specific amount of time sufficient to achieve the desired temperature of the projector.

At S1230, a steady state temperature of the projector during a second duty cycle may be achieved and identified.

At S1240, based on the steady state temperature, changing the second duty cycle thereby regulating the temperature to avoid interruptions in projector operations. By changing the second duty cycle, the temperature of the projector is effectively regulated to avoid overheating of the projector. As a result, the projector operations can be continued without interruptions due to overheating and the like.

12. A Method for Projecting Light in Sync with Image Capturing Device

Figure 13:
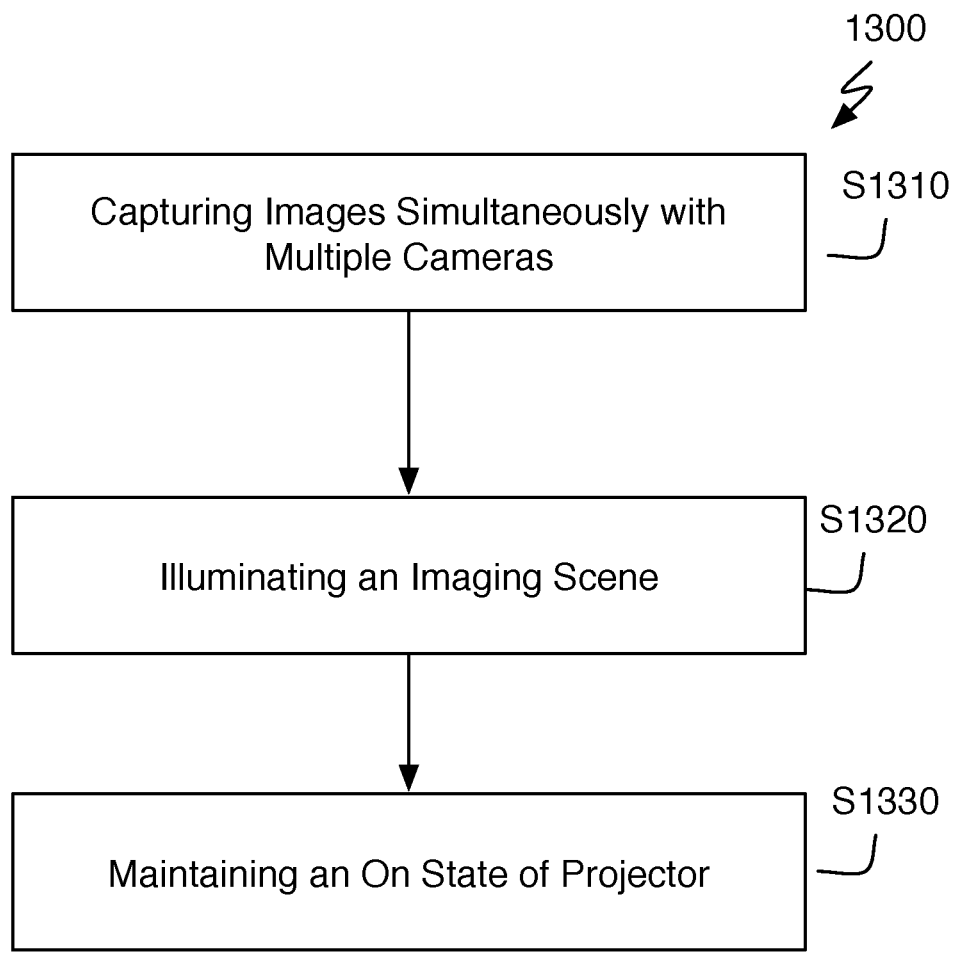
FIG. 13 illustrates a process flow of a method for projecting light in synchronization with an image capture device in accordance with some embodiments of the present application.
Figure 14:
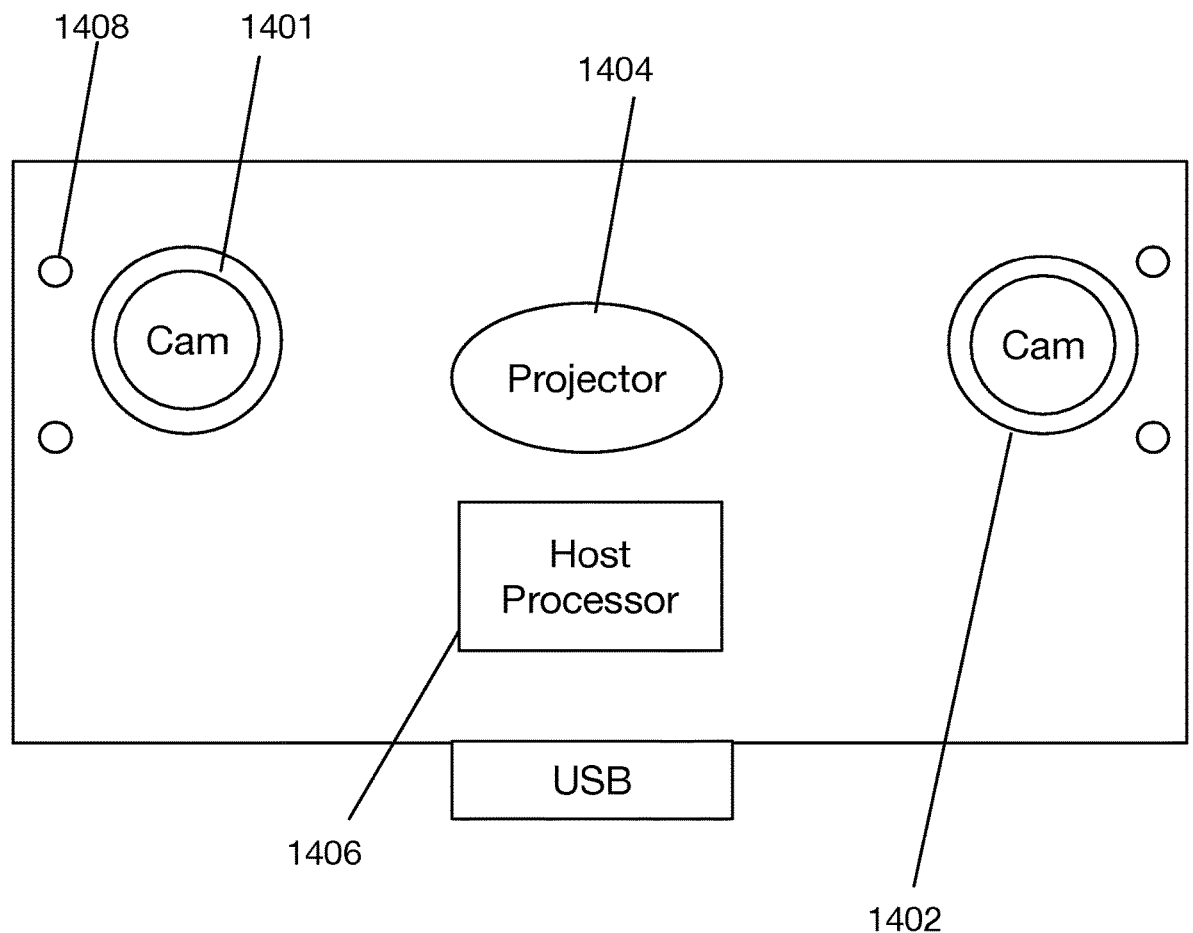
FIG. 14 illustrates a schematic of an apparatus for three-dimensional sensing in accordance with some embodiments of the present application.
Figure 15:
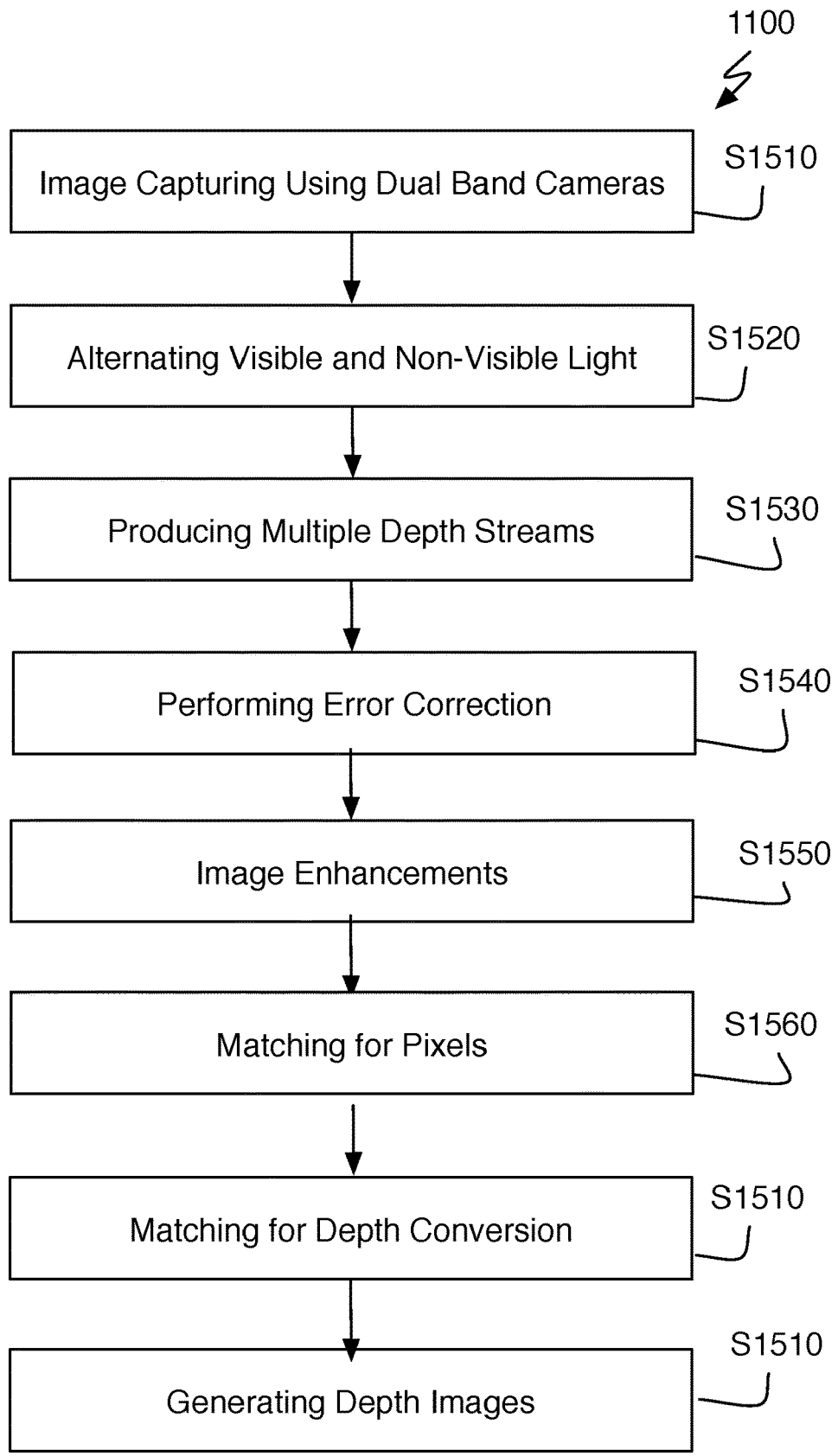
FIG. 15 illustrates a process flow of a further method for three-dimensional sensing in accordance with some embodiments of the present application.

As shown in FIG. 13, a process flow of a method 1300 is provided for projecting light in synchronization with a camera. Thus, method 1300 functions to control the operations of both a projector and one or more cameras to synchronize the operations thereof. Preferably the method 1300 may be used for operating the projector at less than 100% power duty cycle in synchronization with image capture.

At S1310, one or more cameras utilized for 3D sensing, and optionally a camera used for color imaging, are triggered or initiated to simultaneously capture imagery on regular intervals. At a same time or contemporaneously therewith, the projector may also be signaled or triggered to illuminate on intervals, so that the projector operates at a desired power duty cycle.

At S1320, in a preferred embodiment, the projector illuminates an imaging scene while the one or more cameras are actively imaging the scene. This is accomplished by activating the projector with a periodic signal possessing the same period as the one or more cameras, such that the projector signal is active for an interval within the period proportional to the duty cycle, and thus, the projector signal entirely overlaps the interval for which the cameras are imaging, and the start of the activation signal (the leading edge) precedes the start of image capture as much as possible so as to mitigate detrimental effects associated with starting the projector. Accordingly, at S1330, it is ensured that the projector is on for as long a period as possible before the one or more cameras captures or images the scene to thereby mitigate mode hopping.

13. Dual Band Visible Light and Near IR Depth Sensing Camera

For augmented reality, virtual reality, or mixed reality headsets and experiences some of the most commonly desired features are: 1) 3D mapping of a scene, 2) low drift 6 degree of freedom positional tracking, 3) visible color stereo video to feed to each eye for mixed reality, 4) the ability to render virtual content into a real camera feed, and 5) gesture and/or controller tracking. To achieve these features in a robust, high quality way, a significant number of cameras with various configurations are required which increases cost and complexity. As an alternative, it is possible to achieve these features for AR, VR and mixed reality using only 2 cameras and two optical elements including a non-pattern illuminator and a patterned projector.

The first camera 1401 and the second camera 1402 can function together to generate 3D images using passive stereo or active stereo using the pattern from the projector 1404. The first camera 1401 and the second camera 1402 may be any type of image capturing devices including capturing devices configured to capture visible light and/or ultraviolet light. Preferably, the first and second cameras are dual band cameras configured to capture the visible light spectrum and a narrow band of near-infrared light.

Additionally, or alternatively, the host processor 1406 may be a streaming processing such that the image processing is performed outside of the apparatus 1400. Alternatively, the apparatus 1400 may include both a host processor and streaming processor, which allows for some processing to be performed on the apparatus and processing which requires additional processing power to be passed through the streaming processor.

The illuminators 1408 may be any type of an illumination device and in a preferred embodiment, the illuminators 1408 may be near IR light-emitting diodes (LEDs) that output light in the near IR band of the cameras 1401 and 1402. Additionally, the illuminators 1408 may be able to project patterned light. The illuminators 1408 may be positioned at any location along a front face of the apparatus 1400. Alternatively, the one or more illuminators 1408 may be positioned at a periphery of the apparatus 1400 such that the illuminators 1408 are found at the edges of the face of the apparatus 1400 and/or at top, bottom, and/or side faces of the apparatus 1400.

In a preferred embodiment, projector 1404 emits a near infrared pattern that can be seen by the cameras 1401 and 1402 via their near IR band and is visible by the cameras both at the close and far range (for example from 0.1 meters to 5+ meters) and a lens is added to the projector 1404 to increase the projector's field of view. Specifically, the field of view of the projector 1404 may be increased to be in the range of 120-180 degrees diagonal. The projector 1404 may create a pattern using a diffractive optical element (DOE).

The cameras 1401 and 1402 preferably can be streamed at a high frame rate such as 60 Hz, and then the projector 1404 and diffuse illuminators 1408 can be turned on for alternate camera frames by the host processor 1406. In this configuration, when the projector 1404 is turned on, the cameras 1401 and 1402 see a near IR pattern projected onto the scene (the "pattern stereo pair") and can use this to compute a dense stereo map at half the frame rate of the cameras 1401 and 1402. When the diffuse illuminators 1408 are on, they can be configured to only provide high signal in the close range on a controller with retro-reflective material that is configured to be especially reflective in the wavelength range of the illuminators 1408 or in the very close range on human hands, so that the visible spectrum should generally see low interference from the diffuse illuminators 1408, allowing for stereo visible color video pass through from the cameras 1401 and 1402, but still allowing for controller tracking and/or gesture tracking since enough signal will be seen on a controller or hands (the "visible/diffuse stereo pair"). It shall be noted in this regard that the diffuse illuminators 1408 are able to project light in a same or overlapping infrared or ultraviolet light spectrum as the projector 1404. The visible/diffuse stereo pair can also be used for 6 degree of freedom positional tracking using sparse feature points where the 3D position of these points can be triangulated using the optical properties of the camera modules and the geometric relationship between the camera modules, or using a dense tracking method.

The pattern stereo pair generated by the apparatus 1400 would include signal from the visible spectrum in addition to the signal from the pattern projector 1404, making it to view a pattern projected by the projector 1404. However, since the diffuse illuminators 1408 produce the visible/diffuse pair that is dominated by visible spectrum signal, it is possible to compute a higher signal-to-noise ratio (SNR) on the pattern stereo pair by subtracting the visible/diffuse stereo pair from the pattern stereo pair.

Additionally, or alternatively, the projector 1404 may be configured to pulse with a short pulse duration and the cameras 1401 and 1402 may be configured to have a correspondingly short exposure time during capture of the pattern stereo pair. In this way, the pattern stream stereo pair can be captured with each pulse during the short duration. A technical benefit of this configuration is that it reduces the SNR of the visible spectrum (e.g., <750 nm) while increasing the SNR of the infrared received projector 1404 signal.

Additionally, or alternatively, the first and second cameras may be configured to have slightly different IR bands. For instance, in one configuration, the IR bands of the first and second camera are slightly different such that both overlap the projector band but see different bands otherwise. In another example configuration, one of the first and second camera does not view IR at all (e.g., single pass). Accordingly, the differences between the bands can be used to recover a true color or any captured scene.

Additional, or alternatively, the host processor 1406 can either perform computation itself for stereo depth, positional tracking, gesture/controller tracking, and/or color correction for mixed reality pass-through, or it can stream the cameras via USB to another processor where computation can be performed.

The methods of the preferred embodiment and variations thereof can be embodied and/or implemented at least in part as a machine configured to receive a computer-readable medium storing computer-readable instructions. The instructions are preferably executed by computer-executable components preferably integrated with the 3D image capture system. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

As a person skilled in the art will recognize from the previous detailed description and from the figures and claims, modifications and changes can be made to the preferred embodiments of the invention without departing from the scope of this invention defined in the following claims.

We claim:

1. A method for safely implementing a projector module, the method comprising:

measuring first light from a projector of the projector module, capturing, using a photodiode, and storing a level of ambient light; and detecting an event indicating that the ambient light received at the photodiode, while the projector is in an on state, is outside normal operating conditions; and signaling a transition of the projector from an on state to an off state based on detecting the event.

2. The method of claim 1, wherein capturing the level of the ambient light includes capturing with the photodiode the level of the ambient light when the projector is in an off state.

3. The method of claim 1, wherein capturing the level of the ambient light includes capturing with a second photodiode external to the projector module the level of the ambient light.

4. The method of claim 1, wherein the event relates to one or more of a broken optical element in the projector module, a missing optical element in the projector module, an abnormal laser operation, and a proximity of an illuminated scene to an apparatus housing the projector module.

5. The method of claim 1, wherein the signaling causes a power to the projector to be terminated thereby placing the projector into the off state.

6. The method of claim 1, wherein detecting the event includes:
compensating the light received at the photodiode by subtracting the level of the ambient light.

7. The method of claim 1, wherein detecting the event includes:
modifying fault thresholds for triggering the event as a function of the level of the ambient light.

8. A system comprising:
a projector for projecting first light into an environment;
a first sensor for capturing first data associated ambient light of the environment;
one or more processors;
non-transitory computer-readable media storing computer-executable instructions, which when executed by the one or more processors cause the one or more processors to:
access the first data captured by the sensor;
estimate an amount of the ambient light associated with the projector while the projector is in an on state based at least in part on the first data;
detect, based at least in part on the estimate, an event indicating that amount of light is does not meet normal operating conditions; and
cause a transition of the projector from an on state to an off state based on the event.

9. The system of claim 8, further comprising a second sensor system for capturing second data associated with the environment and wherein estimating the amount of the ambient light is based at least in part on the second data.

10. The system of claim 9, wherein the first sensor is a first photodiode and the second sensor is a second photodiode.

11. The system of claim 8, wherein the event relates to one or more of a broken optical element in the projector, a missing optical element in the projector, an abnormal laser operation, or a proximity of an illuminated scene to an apparatus housing the projector.

12. The system of claim 8, wherein the transition includes sending a signal causing power to the projector to be terminated.

13. The system of claim 8, wherein estimating the amount of the ambient light is based at least in part on a level of ambient light associated with the environment.

14. The system of claim 8, wherein the normal operating conditions include one or more fault thresholds.

15. One or more non-transitory computer-readable media storing instructions that, when executed, cause one or more processors to perform operations comprising:
causing a sensor to measure first light from a projector module;
causing a first photodiode to capture first data associated with a level of ambient light while the projector module is in an on state;
storing the first data;
detecting, based at least in part on the level of the ambient light, that the projector module is operating outside one or more normal operating conditions; and
sending, in response to detecting the projector module is operating outside of the one or more normal operating conditions, a signal to the project to cause the projector module to a transition from an on state to an off state.

16. The one or more non-transitory computer-readable media as recited in claim 15, wherein the operations further comprise capturing using the first photodiode, second data associated with a level of the ambient light while the projector module is in an off state and detecting the projector module is operating outside one or more normal operation conditions is based at least in part on the second data.

17. The one or more non-transitory computer-readable media as recited in claim 15, wherein the first data includes data captured by a second photodiode.

18. The one or more non-transitory computer-readable media as recited in claim 15, wherein detecting that the projector module is operating outside the one or more normal operating conditions comprises detecting one or more of the following:
a broken optical element in the projector module;
a missing optical element in the projector module;
an abnormal laser operation; or
a proximity of an illuminated scene to an apparatus housing the projector module.

19. The one or more non-transitory computer-readable media as recited in claim 15, wherein sending the signal to the project further comprises sending a signal to terminate a power signal associated with the projector module.

20. The one or more non-transitory computer-readable media as recited in claim 15, wherein the projector module is operating outside of the one or more normal operating conditions further comprises compensating the first data by subtracting a known level of the ambient light.

* * * * *